(12) United States Patent
Isoda et al.

(10) Patent No.: US 9,872,409 B2
(45) Date of Patent: Jan. 16, 2018

(54) DEVICE MODULE AND METHOD OF MANUFACTURING THE SAME

(71) Applicant: HOSIDEN CORPORATION, Yao-shi (JP)

(72) Inventors: Takeshi Isoda, Yao (JP); Koji Shinoda, Yao (JP)

(73) Assignee: HOSIDEN CORPORATION, Yao-Shi (JP)

( * ) Notice: Subject to any disclaimer, the term of this patent is extended or adjusted under 35 U.S.C. 154(b) by 178 days.

(21) Appl. No.: 13/958,926

(22) Filed: Aug. 5, 2013

(65) Prior Publication Data
US 2014/0043772 A1 Feb. 13, 2014

(30) Foreign Application Priority Data

Aug. 7, 2012 (JP) .................................. 2012-174791

(51) Int. Cl.
*H05K 7/00* (2006.01)
*B29C 45/14* (2006.01)
(Continued)

(52) U.S. Cl.
CPC ......... *H05K 7/00* (2013.01); *B29C 45/14467* (2013.01); *B29C 45/14639* (2013.01);
(Continued)

(58) Field of Classification Search
CPC .......... H05K 7/00; H05K 13/04; H01L 23/13; H01L 23/3107; H01L 23/49861;
(Continued)

(56) References Cited

U.S. PATENT DOCUMENTS 4,338,621 A * 7/1982 Braun .......................... 257/697
4,480,262 A * 10/1984 Butt .............................. 257/675
(Continued)

FOREIGN PATENT DOCUMENTS

DE 102011117985 5/2013
EP 1672972 6/2006
(Continued)

OTHER PUBLICATIONS

Extended European Search Report dated Nov. 19, 2013 issued in counterpart application No. 13250087.7.
(Continued)

*Primary Examiner* — David M Sinclair
*Assistant Examiner* — Theron S Milliser
(74) *Attorney, Agent, or Firm* — Kratz, Quintos & Hanson, LLP

(57) ABSTRACT

The invention provides a device module including a base, a plastic part, and an external connection. The plastic part is provided on the base. The device is provided on the base and embedded in the plastic part. The device is a sensor, an electronic device, or a circuit board. The external connection includes an embedded portion and a lead-out portion. The embedded portion is connected to the device, extends along the base, and is embedded in the plastic part. The lead-out portion is contiguous with the embedded portion and led out of the plastic part.

15 Claims, 16 Drawing Sheets

(51) Int. Cl.
| | |
|---|---|
| *H05K 13/04* | (2006.01) |
| *H01L 23/31* | (2006.01) |
| *H01L 23/13* | (2006.01) |
| *H01L 23/498* | (2006.01) |
| *H01L 21/48* | (2006.01) |
| *H01L 21/56* | (2006.01) |

(52) U.S. Cl.
CPC .......... *H05K 13/04* (2013.01); *H01L 21/4846* (2013.01); *H01L 21/565* (2013.01); *H01L 23/13* (2013.01); *H01L 23/3107* (2013.01); *H01L 23/49861* (2013.01); *H01L 2924/0002* (2013.01); *Y10T 29/4913* (2015.01)

(58) Field of Classification Search
CPC ......... H01L 21/4846; H01L 2924/0002; H01L 21/565; B29C 45/14467; B29C 45/14639; Y10T 29/4913
See application file for complete search history.

(56) References Cited

U.S. PATENT DOCUMENTS

| | | | | |
|---|---|---|---|---|
| 4,561,006 | A * | 12/1985 | Currie | 257/697 |
| 4,582,388 | A * | 4/1986 | Swaffield | 439/606 |
| 4,607,276 | A * | 8/1986 | Butt | 257/674 |
| 4,816,426 | A * | 3/1989 | Bridges et al. | 29/827 |
| 4,823,234 | A * | 4/1989 | Konishi et al. | 361/718 |
| 4,827,376 | A * | 5/1989 | Voss | 361/708 |
| 4,894,023 | A * | 1/1990 | Hall | 439/278 |
| 4,935,174 | A * | 6/1990 | Suzuki | 264/440 |
| 5,103,292 | A * | 4/1992 | Mahulikar | 257/697 |
| 5,319,522 | A * | 6/1994 | Mehta | 361/748 |
| 5,610,799 | A * | 3/1997 | Kato | 361/752 |
| 5,710,695 | A * | 1/1998 | Manteghi | 361/813 |
| 5,715,594 | A | 2/1998 | Patterson et al. | |
| 5,793,613 | A * | 8/1998 | Poinelli et al. | 361/723 |
| 5,828,126 | A * | 10/1998 | Thomas | 257/695 |
| 5,914,531 | A | 6/1999 | Tsunoda et al. | |
| 6,433,728 | B1 * | 8/2002 | Krupp et al. | 341/176 |
| 6,653,724 | B1 * | 11/2003 | Kim et al. | 257/684 |
| 6,950,068 | B2 * | 9/2005 | Bordi et al. | 343/702 |
| 7,146,721 | B2 * | 12/2006 | Hunkeler et al. | 29/841 |
| 7,166,812 | B2 * | 1/2007 | White et al. | 200/341 |
| 7,194,910 | B2 * | 3/2007 | Gatesman | 73/753 |
| 7,217,153 | B2 * | 5/2007 | Sugimoto et al. | 439/500 |
| 7,679,923 | B2 * | 3/2010 | Inagaki et al. | 361/752 |
| 7,804,450 | B2 * | 9/2010 | Sullivan et al. | 343/700 MS |
| 8,441,117 | B2 * | 5/2013 | Soyano | 257/693 |
| 2002/0180424 | A1 * | 12/2002 | Aoki et al. | 324/173 |
| 2004/0119701 | A1 * | 6/2004 | Mulligan | G06F 3/044 345/173 |
| 2004/0147297 | A1 * | 7/2004 | Mikkola et al. | 455/575.7 |
| 2004/0248439 | A1 * | 12/2004 | Gernhardt et al. | 439/83 |
| 2005/0057902 | A1 * | 3/2005 | Sasaki et al. | 361/717 |
| 2005/0136852 | A1 * | 6/2005 | Nakagawa et al. | 455/90.3 |
| 2010/0288632 | A1 * | 11/2010 | Say et al. | 204/403.01 |
| 2013/0308838 | A1 * | 11/2013 | Westerman | G06K 9/0008 382/125 |

FOREIGN PATENT DOCUMENTS

| | | |
|---|---|---|
| EP | 1677583 | 7/2006 |
| EP | 2366526 | 9/2011 |
| EP | 2421089 | 2/2012 |
| JP | 2011-126236 A1 | 6/2011 |
| JP | 2012-10341 A1 | 1/2012 |
| JP | 2012-011691 | 1/2012 |
| JP | 2012-138594 A1 | 7/2012 |
| WO | 2009/035038 A1 | 3/2009 |

OTHER PUBLICATIONS

Communication pursuant to Article 94(3)(office action) dated Mar. 13, 2015 for the counterpart European patent application No. 13250087.7.
Notification of Reasons for Refusal (office action) for Patent Application No. 2012-174791 dated Jul. 9, 2013.

* cited by examiner

DEVICE MODULE AND METHOD OF MANUFACTURING THE SAME

CROSS-REFERENCE TO RELATED APPLICATIONS

The present application claims priority under 35 U.S.C. §119 of Japanese Patent Application No. 2012-174791 filed on Aug. 7, 2012, the disclosure of which is expressly incorporated by reference herein in its entity.

BACKGROUND OF THE INVENTION

Technical Field

The invention relates to device modules and methods of manufacturing the device modules.

Background Art

Japanese Unexamined Patent Publication No. 2011-126236 discloses a device module including a film, a plastic part provided on the film, a functional device embedded in the plastic part, and a transmission cable. The transmission cable has a first portion and a second portion excluding the first portion. The first portion is connected to the functional device and embedded in the plastic part together with the functional device. The second portion protrudes from the plastic part in the thickness direction of the plastic part.

SUMMARY OF INVENTION

When the plastic part is molded on the film using a die, the second portion of the transmission cable is placed in a housing recess of a die. The housing recess communicates with a cavity of the dies. To prevent the ingress of plastic material into the housing recess, the shape of the housing recess should conform to the outer shape of the second portion of the transmission cable. This makes it very difficult to insert the second portion of the transmission cable into the housing recess of the die.

The invention provides a device module that can be manufactured without inserting a part of an external connection into a housing recess of the die. The invention also provides a method of manufacturing the device module.

A device module according to an aspect of the invention includes a base, a plastic part, and an external connection. The plastic part is provided on the base. The device is provided on the base and embedded in the plastic part. The device is a sensor, an electronic device, or a circuit board. The external connection includes an embedded portion and a lead-out portion. The embedded portion is connected to the device, extends along the base, and is embedded in the plastic part. The lead-out portion is contiguous with the embedded portion and led out of the plastic part.

In the device module in accordance with this aspect, the embedded portion of the external connection is embedded in the plastic part and extends along the base. The lead-out portion of the external connection is contiguous with the embedded portion and led out of the plastic part. This arrangement makes it possible to embed the plastic part (mold plastic material) placing the base, the device, and the embedded portion of the external connection into a cavity of first and second dies and holding the lead-out portion of the external connection between the first and second dies or between the first die and the base. Therefore, it is possible to manufacture the device module without inserting the lead-out portion of the external connection into a housing recess of a die, unlike the conventional device module described above. Moreover, the embedded portion of the external connection is located on the base, and the lead-out portion of the external connection is held between the first and second dies or between the first die and the base. This arrangement reduces the possibility of movement of the external connection if pressed by the plastic material injected into the cavity.

The base may include a base body and an affixed portion. The base body may be fixed to the plastic part. The affixed portion may be contiguous with the base body and not fixed to the plastic part. The lead-out portion may be affixed to and extends along the affixed portion.

In the device module in accordance with this aspect, the affixed portion and the lead-out portion affixed thereto are held in a collective manner between the first and second dies when molding the plastic part. Therefore, the lead-out portion is protected by the affixed portion against one of the first and second dies.

The plastic part may include a plastic body and a protruding portion contiguous with the plastic body. The plastic body may be affixed to the base. The lead-out portion may include a fixed portion and a free portion contiguous with the fixed portion. The fixed portion may be affixed to and extending along the protruding portion.

The device module may further include a protecting part configured to partially cover the lead-out portion. In the device module in accordance with this aspect, the lead-out portion is protected by the protecting part.

The protecting part may be continuously connected or affixed to the plastic part. This aspect of the invention can improve the tensile strength of the lead-out portion.

The lead-out portion may be partially affixed to an outer face of the plastic part. The base may have at least one of a film or a plastic material.

The sensor may be a film sensor. The external connection may be of film shape to be provided integrally with the sensor.

A first method of manufacturing a device module according to the invention includes preparing a device, an external connection, and a base, the device being a sensor, an electronic device, or a circuit board, the external connection including a lead-out portion and an embedded portion, and the embedded portion being connected to the device; affixing the device and the embedded portion of the external connection onto the base; followed by placing the base, the device, and the embedded portion of the external connection in a cavity of first and second dies, and holding the lead-out portion of the external connection between the first and second dies or between the first die and the base; and in this state, injecting a plastic material onto the base in the cavity to insert-mold the device and the embedded portion of the external connection in the plastic material.

According to the first method, the embedded portion of the external connection as fixed to the base is placed in the cavity, and the lead-out portion of the external connection is held between the first and second dies or between the first die and the base. This method makes it possible to manufacture the device module without inserting the lead-out portion of the external connection into a housing recess of a die. Moreover, the embedded portion is fixed to the base, and the lead-out portion is held between the first and second dies or between the first die and the base. It is therefore possible to reduce the possibility of movement of the external connection if pressed by the plastic material injected into the cavity.

The affixing of the embedded portion may include affixing the embedded portion in such a manner as to extend from the device on the base to an end of the base. According to the first method of this aspect, by fixing the embedded portion so as to extend from the device on the base to the end of the base, the lead-out portion protrudes from the end of the base. Accordingly, the method makes it easy to hold the lead-out portion between the first and second dies or between the first die and the base.

The base may include a base body and an affixed portion. The affixed portion may be contiguous with the base body. The affixing onto the base may include affixing the device and the embedded portion of the external connection onto the base body of the base and affixing the lead-out portion of the external connection onto the affixed portion of the base. The placing in the cavity may include placing the base body of the base, the device, and the embedded portion of the external connection in the cavity. The holding between the first and second dies may include holding the lead-out portion of the external connection and the affixed portion of the base between the first and second dies. The injection of the plastic material may include injecting the plastic material onto the base body of the base and thereby insert molding the device and the embedded portion of the external connection in the plastic material. According to the first method of this aspect, as the lead-out portion and the affixed portion are held between the first and second dies, the affixed portion protects the lead-out portion against one of the first and second dies.

The lead-out portion may include a fixed portion contiguous with the embedded portion and a free portion contiguous with the fixed portion. The placing in the cavity may include disposing the fixed portion of the lead-out portion along a wall of the cavity. The holding between the first and second dies may include holding the free portion of the lead-out portion between the first and second dies. The injection of the plastic material may include injecting the plastic material onto the base in the cavity to insert-mold the device, the embedded portion of the external connection, and the fixed portion of the lead-out portion of the external connection in the plastic material.

According to the first method of this aspect, a part (the fixed portion) of the external connection can be fixed not to the portion of the plastic part on the base but to another portion of the plastic part. Therefore, the method provides a higher degree of flexibility in design.

The lead-out portion may include a fixed portion contiguous with the embedded portion and a free portion contiguous with the fixed portion. The placing in the cavity may include disposing the fixed portion of the lead-out portion in midair in the cavity. The holding between the first and second dies may include holding the free portion of the lead-out portion between the first and second dies. The injection of the plastic material may include injecting the plastic material onto the base in the cavity to insert-mold the device, the embedded portion of the external connection, and the fixed portion of the lead-out portion of the external connection in the plastic material.

According to the first method of this aspect, the fixed portion of the lead-out portion can be disposed in midair in the cavity when insert-molded in the plastic material. That is, a part (the fixed portion) of the external connection can be embedded not in the portion of the plastic part on the base but in another portion of the plastic part. Therefore, the method provides a higher degree of flexibility in design.

The holding of the lead-out portion of the external connection between the first and second dies may include holding the lead-out portion also between the first die and the base.

A second method of manufacturing a device module according to the invention includes preparing an external connection, a device, a protecting part, and a base, the external connection including an embedded portion and a lead-out portion, and the device being a sensor, an electronic device, or a circuit board and connected to the embedded portion, and the protecting part partially covering the lead-out portion; affixing the device and the embedded portion of the external connection onto the base; placing the base, the device, and the embedded portion of the external connection into a cavity of the first and second dies, and holding the protecting part between the first and second dies or between the first die and the base; and in this state, injecting a plastic material onto the base in the cavity to insert-mold the device and the embedded portion of the external connection in the plastic material.

According to this second method, the embedded portion of the external connection as fixed to the base is placed in the cavity. Also, the protecting part, which partially covers the lead-out portion of the external connection, is held between the first and second dies or between the first die and the base. This method makes it possible to manufacture the device module without inserting the lead-out portion of the external connection into a housing recess of a die. Moreover, the embedded portion is fixed to the base, and the protecting part with the lead-out portion passing therethrough is held between the first and second dies or between the first die and the base. It is therefore possible to reduce the possibility of movement of the external connection if pressed by the plastic material injected into the cavity. Further, as the protecting part is held between the first and second dies or between the first die and the base, the protecting part protects the lead-out portion against the first and second dies or against the first die and the base.

The holding of the protecting part may include disposing a part of the protecting part in the cavity. The injection of the plastic material may include affixing the part of the protecting part to the plastic material injected in the cavity. The second device method of this aspect makes it easy to affix the protecting part to the plastic part.

DESCRIPTION OF EMBODIMENTS

The First to Seventh Embodiments of the invention will be described below.

First Embodiment

Figure 1:
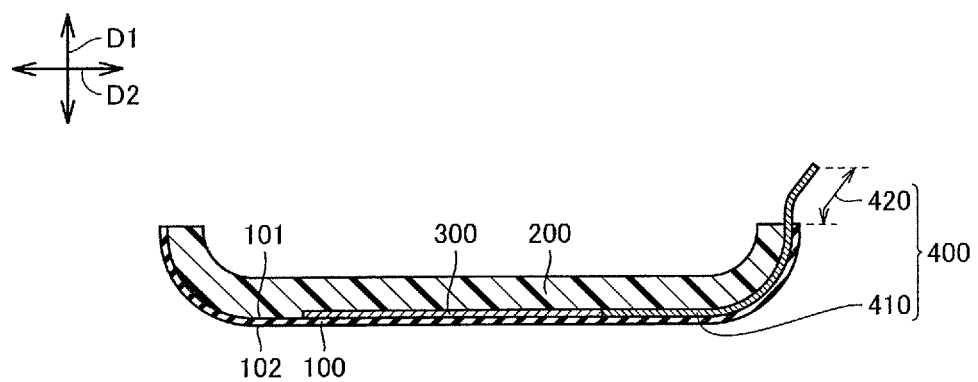
FIG. 1 is a schematic sectional view of a device module in accordance with the First Embodiment of the invention.

First, a device module in accordance with the First Embodiment of the invention will be described with reference to FIG. 1. The device module shown in FIG. 1 is a touch sensing device. The device module includes a base 100, a plastic part 200, a touch sensor 300 (device), and an external connection 400. These constituents of the device module will be described below in detail. In FIG. 1, D1 refers to the thickness direction of the device module and the plastic part 200, and D2 refers to the lengthwise direction of the device module. D1 is orthogonal to D2. The short direction (not shown) of the device module is orthogonal to D1 and D2.

The base 100 is a generally rectangular flexible film of optically transparent plastic material such as a PET (polyethylene terephthalate) film or an acrylic film. The base 100 has a first face 101 (an inner face) and a second face 102 (an outer face). Ornamental printing is provided on the entire region or a partial region (e.g., a circumferential region, or one end in the lengthwise direction D2 or in the short direction) of the first face 101 of the base 100.

The plastic part 200 is an insulating member of thermo-softening or thermosetting plastic material (e.g. polycarbonate (PC), polymethylmethacrylate (PMMA), epoxy resin, or the like). The plastic part 200 is generally of U-shape in sectional view and provided on the first face 101 of the base 100. As it is formed on the first face 101 of the base 100, the base 100 generally adheres to or is integrated with the plastic part 200 and has hardened (has lost flexibility) generally in a U-shaped curve extending along the plastic part 200. The second face 102 of the base 100 has a flat central area serving as a touch sensing surface of the device module.

The touch sensor 300 is a capacitive touch panel of generally rectangular shape and in rigid or flexible sheet form. The touch sensor 300 can detect a detection object such as a finger that touches the touch sensing surface of the base 100. The touch sensor 300 is fixed to the central area of the first face 101 of the base 100 and embedded in the plastic part 200. The touch sensor 300 extends substantially parallel to the touch sensing surface of the base 100.

If the touch sensor 300 is in a rigid transparent sheet form, it may have any one of the configurations (1) to (3) indicated below. If the touch sensor 300 is in a flexible transparent sheet form (if it is a film sensor), it may have any one of the configurations (4) to (6) indicated below.

1) The touch sensor 300 includes a first transparent substrate having first and second faces in its thickness direction D1, a plurality of first transparent electrodes provided on the first face of the first transparent substrate, and a plurality of second transparent electrodes provided on the second face of the first transparent substrate.

2) The touch sensor 300 includes a first transparent substrate, a plurality of first transparent electrodes provided on the first transparent substrate, an insulating layer provided on the first transparent substrate so as to cover the first transparent electrodes, and a plurality of second transparent electrodes provided on the insulating layer.

3) The touch sensor 300 includes a first transparent substrate having a first face, a second transparent substrate having a first face opposed to the first face of the first transparent substrate, a plurality of first transparent electrodes provided on the first face of the first transparent substrate, and a plurality of second transparent electrodes provided on the first face of the second transparent substrate.

4) The touch sensor 300 includes a flexible insulating first transparent film having first and second faces in its thickness direction D1, a plurality of first transparent electrodes provided on the first face of the first transparent film, and a plurality of second transparent electrodes provided on the second face of the first transparent film.

5) The touch sensor 300 includes a flexible insulating first transparent film, a plurality of first transparent electrodes provided on the first transparent film, a flexible insulating second transparent film provided on the first transparent film so as to cover the first transparent electrodes, and a plurality of second transparent electrodes provided on the second transparent film.

6) The touch sensor 300 includes a flexible insulating first transparent film having a first face, a flexible insulating second transparent film having a first face opposed to the first face of the first transparent film, a plurality of first transparent electrodes provided on the first face of the first transparent film, and a plurality of second transparent electrodes provided on the first face of the second transparent film.

The external connection 400 is flexible. Specifically, the external connection 400 is a flexible printed circuit or a flexible and insulating transparent film. The external connection 400 has an embedded portion 410 and a lead-out portion 420. The embedded portion 410 is fixed to the first face 101 of the base 100 and embedded in the plastic part 200. The embedded portion 410 includes a lengthwise first end of the external connection 400. If the external connection 400 is a flexible printed circuit, the first end of the external connection 400 is connected to at least one of the first and second transparent substrates of the touch sensor 300, or to at least one of the first and second transparent films of the touch sensor 300. Such a flexible printed circuit includes a plurality of conductive lines connected to first and second transparent electrodes. If the external connection 400 is a transparent film, the first end of the external connection 400 is integrally connected to at least one of the first and second transparent substrates of the touch sensor 300, or to at least one of the first and second transparent films of the touch sensor 300. Such a transparent film includes a plurality of conductive lines connected to the first and second transparent electrodes. The embedded portion 410 extends along the first face 101 of the base 100, from the touch sensor 300 to an end of the base 100. The lead-out portion 420 is a portion excluding the embedded portion 410 of the external connection 400 and contiguous with the embedded portion 410. The lead-out portion 420 is led out of an end face of the plastic part 200. The lead-out portion 420 has a lengthwise second end of the external connection 400.

Figure 2:
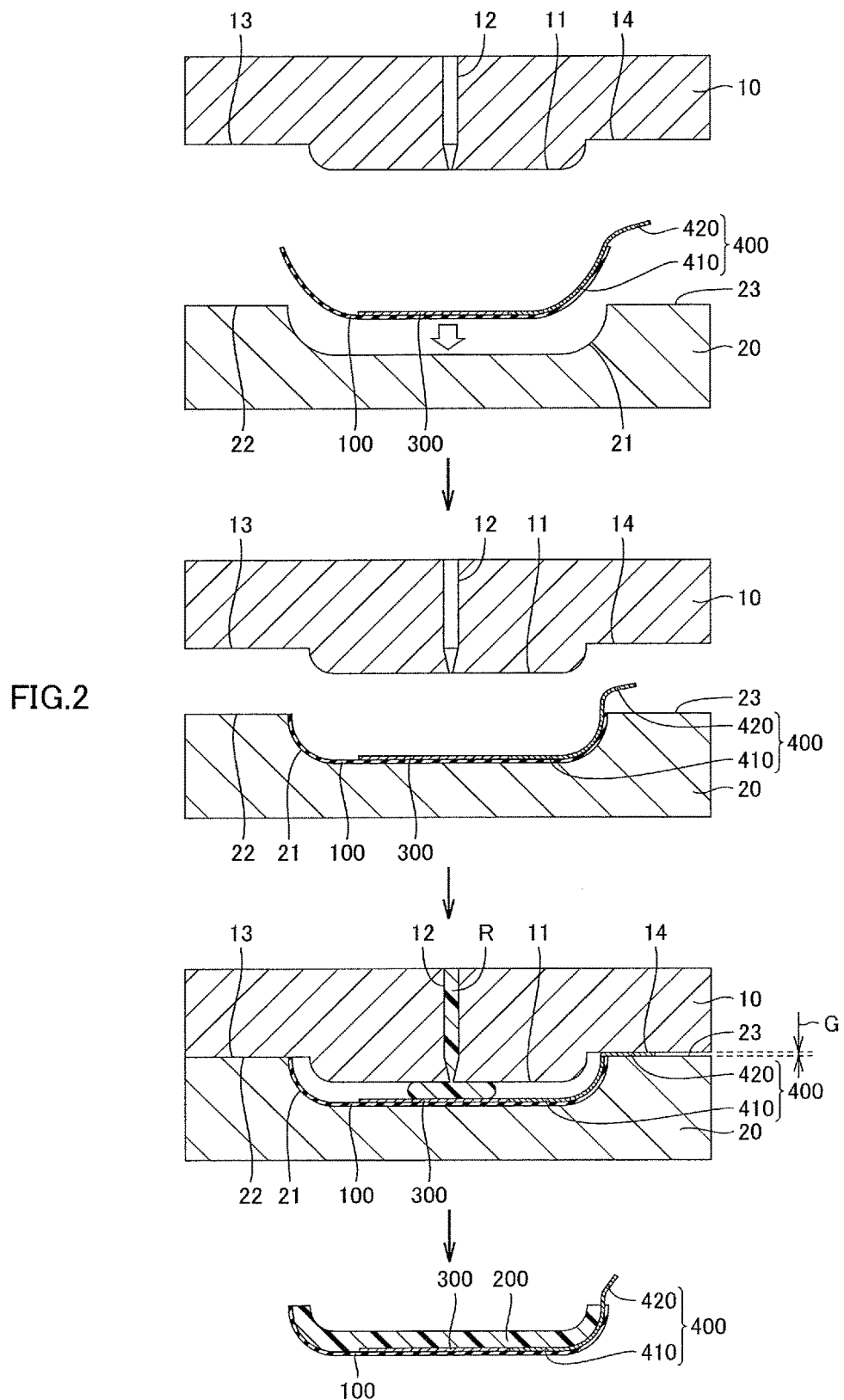
FIG. 2 is a view illustrating a manufacturing process of the device module.

The device module described above may be manufactured using first and second dies 10, 20 as illustrated in FIG. 2. The first die 10 includes a projection 11, a sprue 13, and first and second split faces 13, 14. The projection 11 projects in the thickness direction D1 (downward in FIG. 2) toward the second die 20. The sprue 12 passes through the first die 10 in the thickness direction D1. The first split face 13 is located on one side in the lengthwise direction D2 of the projection 11, and the second split face 14 is located on the other side in the lengthwise direction D2 of the projection 11. The second split face 14 is located further in the other thickness direction D1 (higher in FIG. 2) than the first split face 13 by the thickness of the lead-out portion 420 of the external connection 400.

The second die 20 has a recess 21 and first and second split faces 22, 23. The recess 21 is adapted to receive the projection 11 and has a dimension in the thickness direction D1 (i.e. depth) larger than the dimension in the thickness direction D1 (i.e. height) of the projection 11. When the first and second dies 10, 20 are closed together, the recess 21 receives the projection 11, and the projection 11 and the recess 21 define a space. This space serves as a cavity of the first and second dies 10, 20. The cavity is of shape conforming to the outer shape of the device module excluding the lead-out portion 420. The first split face 22 is located on the one side in the lengthwise direction D2 of the recess 21, and the second split face 23 is located on the other side of the recess 21 in the lengthwise direction D2. The first and second split faces 22, 23 extend at the same height position. When the first and second dies 10, 20 are closed together, the first split faces 13, 22 are in contact with each other, while a gap G is left between the second split faces 14, 23 corresponding to the thickness of the lead-out portion 420.

A method of manufacturing the device module using the first and second dies 10, 20 will be described below with reference to FIG. 2. The first step is to prepare the base 100 and the touch sensor 300 with the external connection 400 connected thereto. The touch sensor 300 and the embedded portion 410 of the external connection 400 are affixed to the first face 101 of the base 100 with an adhesive. As a result, the embedded portion 410 extends along the base 100, from the touch sensor 300 to the end of the base 100, and the lead-out portion 420 protrudes from an end of the base 100.

The next step is to place the base 100, the external connection 400 of the touch sensor 300, and the embedded portion 410 into the recess 21 of the second die 20. This causes the base 100 to curve generally in U-shape in sectional view conforming to the shape of the wall of the recess 21, and the embedded portion 410 is accordingly curved. In addition, the lead-out portion 420 of the external connection 400 is disposed between the second split faces 14, 23 of the first and second dies 10, 20.

After that, the first and second dies 10, 20 are brought close to each other to be closed together. Then, the projection 11 of the first die 10 is received in the recess 21 of the second die 20. This creates the cavity between the projection 11 and the recess 21. The base 100, the touch sensor 300, and the embedded portion 410 of the external connection 400 are placed in the cavity. At this point, the first split faces 13, 22 of the first and second dies 10, 20 are brought into contact with each other, and the second split faces 14, 23 of the first and second dies 10, 20 holds the lead-out portion 420 of the external connection 400 therebetween.

After that, plastic material R is injected through the sprue 12 of the first die 10 onto the base 100 in the cavity. The cavity is filled with the plastic material R, so that the touch sensor 300 and the embedded portion 410 of the external connection 400 are embedded in the plastic material R on the base 100. The plastic material R hardens to form the plastic part 200. At this point, the base 100 adheres to or becomes integrated with the plastic part 200 and hardens. This is how to insert-mold the touch sensor 300 and the embedded portion 410 of the external connection 400 in the plastic part 200 on the base 100, with the lead-out portion 420 of the external connection 400 led out of an end face of the plastic part 200. Lastly, the first and second dies 10, 20 are separated from each other to take out the completed device module.

The above described device module has at least the following technical features and advantages. First, the embedded portion 410 of the external connection 400 is embedded in the plastic part 200 and extends along the base 100 from the touch sensor 300 to the end of the base 100. The lead-out portion 420 of the external connection 400 is led out of the end face of the plastic part 200. Therefore, the insert-molding process can be performed placing the base 100, the touch sensor 300, and the embedded portion 410 of the external connection 400 in the cavity of the first and second dies 10, 20 while the first and second dies 10, 20 hold therebetween the lead-out portion 420 of the external connection 400. This arrangement makes it possible to manufacture the device module without inserting the lead-out portion 420 of the external connection 400 into a housing recess of a die. Moreover, the touch sensor 300 and the embedded portion 410 of the external connection 400 are affixed onto the base 100, and the lead-out portion 420 of the external connection 400 is held between the first and second dies 10, 20. This arrangement reduces the possibility of movement of the external connection 400 if pressed by the plastic material R injected into the cavity.

Second Embodiment

Figure 3:
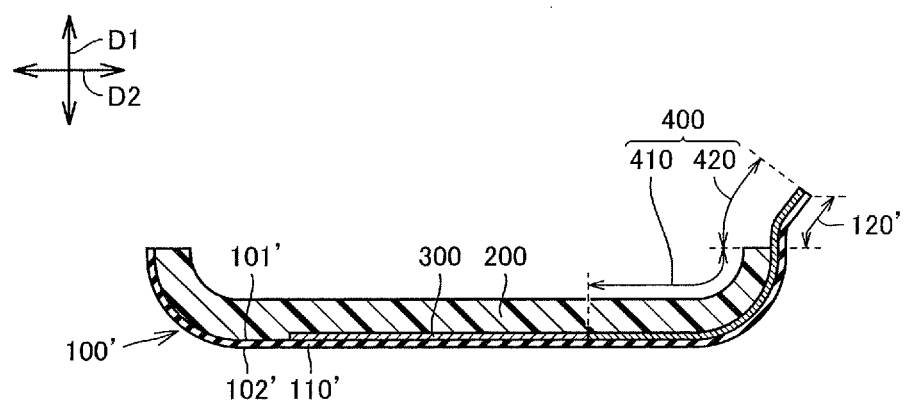
FIG. 3 is a schematic sectional view of a device module in accordance with the Second Embodiment of the invention.

Next, a device module in accordance with the Second Embodiment of the invention will be described with reference to FIG. 3. The device module shown in FIG. 3 has the same configuration as that of the First Embodiment, except for a base 100' of different shape from that of the base 100. This difference will be described below in detail, and overlapping descriptions will be omitted. A symbol _'_ is added to the reference numerals of the base and its subelements in this embodiment to distinguish them from those of the First Embodiment. FIG. 3 also indicates the directions D1 and D2.

The base 100' is a generally rectangular flexible film of optically transparent plastic material such as a PET (polyethylene terephthalate) film or an acrylic film. The base 100' has first and second faces 101', 102', a base body 110', and an affixed portion 120'. The first face 101' is the inner face of the base 100', and the second face 102' is the outer face of the base 100'. The base body 110' is fixed to the plastic part 200. Ornamental printing is provided on the entire region or a partial region (e.g., a circumferential region, or one end in the lengthwise direction D2 or in the short direction) of the first face 101' of the base body 110'. The affixed portion 120' contiguous with the base body 110' is not fixed to the plastic part 200. That is, the affixed portion 120' extends out of the plastic part 200.

The plastic part 200 is disposed on the first face 101' of the base body 110'. This causes the base body 110' to generally adhere to or be integrated with the plastic part 200 and hardens (the base body 110' is fixed to the plastic part 200 and has lost flexibility) generally in a U-shaped curve extending along the plastic part 200. The second face 102' of the base 100' has a flat central area serving as a touch sensing surface of the device module.

The touch sensor 300 is fixed to the central area of the first face 101' of the base body 110' and is embedded in the plastic part 200. The touch sensor 300 extends substantially parallel to the touch sensing surface. Further, the touch sensor 300 is connected to the embedded portion 410 of the external connection 400, and the touch sensor 300 and the embedded portion 410 are affixed to the first face 101' of the base body 110' and embedded in the plastic part 200. The embedded portion 410 extends along the first face 101' of the base body 110', from the touch sensor 300 to the boundary between the base body 110' and the affixed portion 120'. The lead-out portion 420 is fixed to the first face 101' of the affixed portion 120' and is led out of the end face of the plastic part 200. The lead-out portion 420 extends along the first face 101' of the affixed portion 120'.

Figure 4:
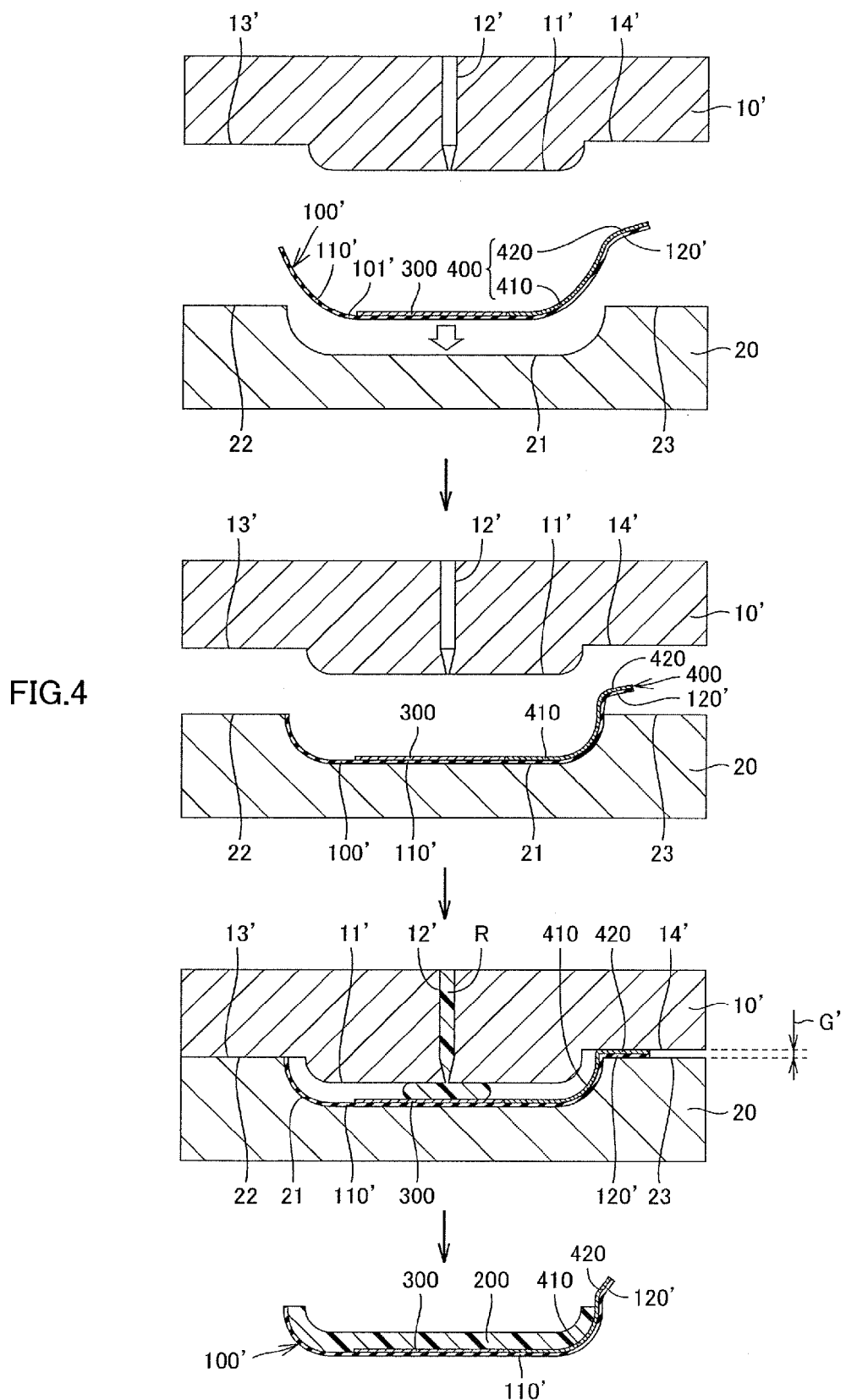
FIG. 4 is a view illustrating a manufacturing process of the device module.

The device module may be manufactured using a first die 10' as shown in FIG. 4. The first die 10' has the same configuration as the first die 10, except that the second split face 14' is at a different height from the second split face 14 as detailed below. This difference will be described below in detail, and overlapping descriptions will be omitted. A symbol _'_ is added to the reference numerals of the first die and its subelements of this embodiment to distinguish them from those of the First Embodiment. The second die 20 has the same configuration as that of the First Embodiment. The cavity of the first and second dies 10', 20 is of shape conforming to the outer shape of the device module excluding the lead-out portion 420 and the affixed portion 120'.

The second split face 14' is located further in the other thickness direction D1 (higher in FIG. 4) than the first split face 13' by the combined thickness of the affixed portion 120' of the base 100' and the lead-out portion 420 of the external connection 400. When the first and second dies 10', 20 are closed together, the first split face 13', 22 are in contact with each other, while a gap G' is left between the second split faces 14', 23 corresponding to the combined thickness of the affixed portion 120' and the lead-out portion 420.

A method of manufacturing the device module using the first and second dies 10', 20 will be described below with reference to FIG. 4. The first step is to prepare the base 100' and the touch sensor 300 with the external connection 400 connected thereto. The touch sensor 300 and the embedded portion 410 of the external connection 400 are affixed to the first face 101' of the base body 110' of the base 100' with an adhesive, and the lead-out portion 420 of the external connection 400 is affixed to the first face 101' of the affixed portion 120' of the base 100' with an adhesive. As a result, the embedded portion 410 extends along the base body 110', from the touch sensor 300 to the above-mentioned boundary, and the lead-out portion 420 extends along the affixed portion 120'.

After that, the base body 110' of the base 100', the touch sensor 300, and the embedded portion 410 of the external connection 400 are placed into the recess 21 of the second die 20. This causes the base body 110' to curve generally in U-shape in sectional view conforming to the shape of the wall of the recess 21, and the embedded portion 410 is accordingly curved. In addition, the affixed portion 120' of the base 100' and the lead-out portion 420 of the external connection 400 are disposed between the second split faces 14', 23 of the first and second dies 10', 20.

After that, the first and second dies 10', 20 are brought close to each other to be closed together. Then, the projection 11' of the first die 10' is inserted into the recess 21 of the second die 20. This generates the cavity between the projection 11' and the recess 21. The base body 110', the touch sensor 300, and the embedded portion 410 of the external connection 400 are placed in the cavity. At this point, the first split face 13', 22 of the first and second dies 10', 20 are brought into contact with each other, and the second split face 14', 23 of the first and second dies 10', 20 hold the affixed portion 120' and the lead-out portion 420 therebetween.

After that, plastic material R is injected through a sprue 12' of the first die 10' onto the base body 110' in the cavity. The cavity is filled with the plastic material R, so that the touch sensor 300 and the embedded portion 410 of the external connection 400 are embedded in the plastic material R on the base body 110'. The plastic material R hardens to form the plastic part 200. At this point, the base body 110' adheres to or becomes integrated with the plastic part 200 and hardens. This is how to insert-mold the touch sensor 300 and the embedded portion 410 of the external connection 400 in the plastic part 200 on the base body 110', with the lead-out portion 420 of the external connection 400 led out of the end face of the plastic part 200. Lastly, the first and second dies 10', 20 are separated from each other to take out the completed device module.

The above described device module has at least the following technical features and advantages. First, the embedded portion 410 of the external connection 400 is embedded in the plastic part 200 and extends along the base body 110' from the touch sensor 300 to the boundary between the base body 110' and the affixed portion 120'. The lead-out portion 420 of the external connection 400 is affixed to the affixed portion 120' and led out of the end face of the plastic part 200. Therefore, the insert-molding process can be performed placing the base body 110', the touch sensor 300, and the embedded portion 410 of the external connection 400 in the cavity of the first and second dies 10', 20 while the first and second dies 10', 20 hold the affixed portion 120' and the lead-out portion 420 therebetween. This arrangement makes it possible to manufacture the device module without inserting the lead-out portion 420 of the external connection 400 into a housing recess of a die. Moreover, the touch sensor 300 and the embedded portion 410 of the external connection 400 are affixed onto the base body 110', and the lead-out portion 420 of the external connection 400 are held between the first and second dies 10', 20. This arrangement reduces the possibility of movement of the external connection 400 if pressed by the plastic material R injected into the cavity. In addition, the first and second dies 10', 20 hold therebetween the lead-out portion 420 together with the affixed portion 120', so that the affixed portion 120' protects the lead-out portion 420 against the second die 20.

Third Embodiment

Figure 5:
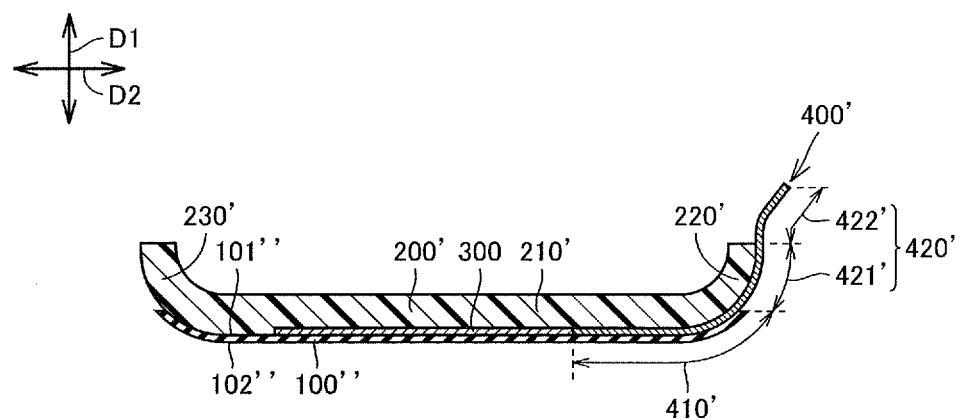
FIG. 5 is a schematic sectional view of a device module in accordance with the Third Embodiment of the invention.

Next, a device module in accordance with the Third Embodiment of the invention will be described with reference to FIG. 5. The device module shown in FIG. 5 has the same configuration as that of the First Embodiment, except for the shape of a base 100", the configuration of a plastic part 200', and the configuration of an external connection 400'. These differences will be described below in detail, and overlapping descriptions will be omitted. A symbol is added to the reference numerals of the base and its subelements of this embodiment to distinguish them from those of the First Embodiment. A symbol _'_ is added to the reference numerals of the plastic part and the external connection and their subelements of this embodiment to distinguish them from those of the First Embodiment. FIG. 5 also indicates the directions D1 and D2.

The base 100" is a generally rectangular flexible film of optically transparent plastic material such as a PET (polyethylene terephthalate) film or an acrylic film. It is smaller in the lengthwise direction D2 than the base 100. The base 100" has a first face 101" (an inner face) and a second face 102" (an outer face). Ornamental printing is provided on the entire region or a partial region (e.g., a circumferential region, or one end in the lengthwise direction D2 or in the short direction) of the first face 101" of the base 100".

The plastic part 200' is an insulating member of thermosoftening or thermosetting plastic material (e.g. polycarbonate (PC), polymethylmethacrylate (PMMA), epoxy resin, or the like). The plastic part 200 is generally of U-shape in sectional view. The plastic part 200' includes a plastic body 210' and protruding portions 220', 230'. The plastic body 210' is disposed on the first face 101" of the base 100". This causes the base 100" to generally adhere to or be integrated with the plastic body 210' and harden (have lost flexibility) generally in a U-shaped curve extending along the plastic body 210'. The touch sensor 300 is fixed to the central area of the first face 101" of the base 100" and embedded in the plastic body 210' of the plastic part 200'. The flat central area of the second face 102" of the base 100" serves as the touch sensing surface of the device module. The touch sensor 300 extends substantially parallel to the touch sensing surface. The protruding portions 220', 230' extend contiguously with the respective opposite ends in the lengthwise direction D2 of the plastic body 210', and they curve in the thickness direction D. In other words, the protruding portions 220', 230' of the plastic part 200' do not exist on the first face 101" of the base 100".

The external connection 400' has the same configuration as the external connection 400, except for the configuration of a lead-out portion 420'. This difference will be described below in detail, and overlapping descriptions will be omitted. The embedded portion 410' of the external connection 400' is affixed onto the first face 101" of the base 100" and embedded in the plastic part 200'. The lead-out portion 420' is a portion excluding the embedded portion 410' of the external connection 400'. The lead-out portion 420' includes a fixed portion 421' contiguous with the embedded portion 410' and a free portion 422' contiguous with the fixed portion 421'. The fixed portion 421' is affixed to and extends along the protruding portion 220' of the plastic part 200'. The free portion 422' protrudes from the end face of the protruding portion 220' of the plastic part 200'.

Figure 6:
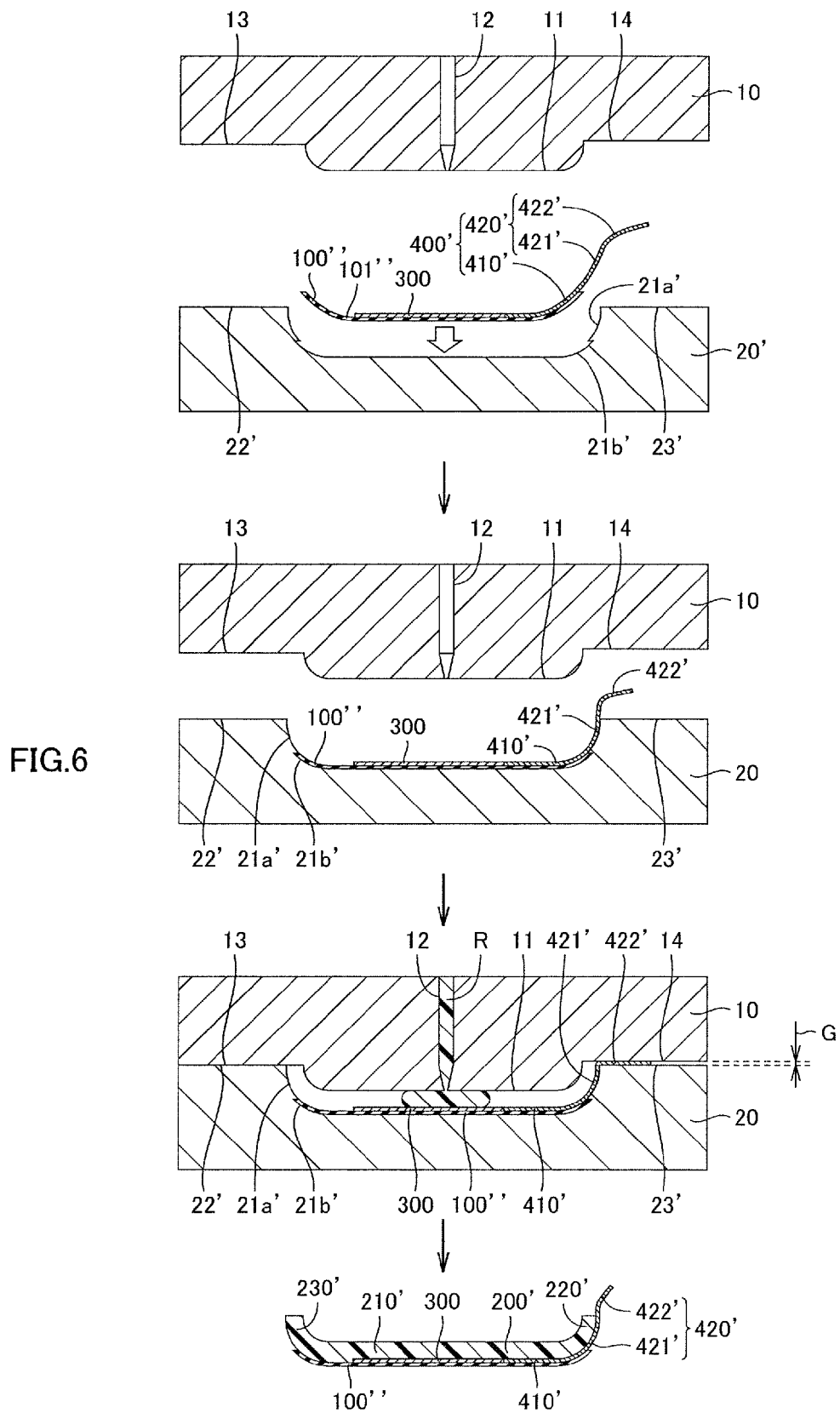
FIG. 6 is a view illustrating a manufacturing process of the device module.

The first die 10 used to manufacture the device module may be the same as that of the First Embodiment. The second die 20', as shown in FIG. 6, has the same configuration as that of the second die 20, except that first and second recesses 21a', 21b' are provided in place of the recess 21. This difference will be described below in detail, and overlapping descriptions will be omitted. A symbol _'_ is added to the reference numerals of the second die and its subelements of this embodiment for the distinction from the second die 20 and its subelements of the First Embodiment.

The first recess 21a' is adapted to receive the projection 11. The second recess 21b' is provided in the bottom of the first recess 21a' and conforms in shape to the base 100". The combined dimension in the thickness direction D1 (combined depth) of the first recess 21a' and the second recess 21b' is larger than the dimension in the thickness direction D1 of the projection 11. When the first die 10, 20' are closed together, the projection 11 is received in the first recess 21a', and the projection 11 and the first and second recesses 21a', 21b' define a space. This space serves as a cavity of the first and second dies 10, 20'. The cavity is of shape conforming to the outer shape of the device module excluding the free portion 422' of the lead-out portion 420'. When the first and second dies 10, 20' are closed together, the first split faces 13, 22' are brought into contact with each other, while a gap G is left between the second split faces 14, 23' corresponding to the thickness of the lead-out portion 420'.

A method of manufacturing the device module using the first and second dies 10, 20' will be described below with reference to FIG. 6. The first step is to prepare the base 100" and the touch sensor 300 with the external connection 400' connected thereto. The touch sensor 300 and the embedded portion 410' of the external connection 400' are affixed onto the first face 101" of the base 100" with an adhesive. As a result, the embedded portion 410' extends along the base 100", from the touch sensor 300 to the end of the base 100", and the lead-out portion 420" protrudes from the end of the base 100".

After that, the base 100" is placed into the second recess 21b' of the second die 20', and the touch sensor 300 and the embedded portion 410' of the external connection 400' are placed into the first recess 21a' of the second die 20'. This causes the base 100" to curve generally U-shape in sectional view conforming to the shape of the wall of the second recess 21b', and the embedded portion 410' is accordingly curved. In addition, the fixed portion 421' of the lead-out portion 420' of the external connection 400' is curved conforming to the shape of the wall of the first recess 21a' (the wall of the cavity) (i.e. disposed along the wall). At this point, the free portion 422' of the lead-out portion 420' is disposed between the second split faces 14, 23' of the first and second dies 10, 20'.

After that, the first and second dies 10, 20' are brought close to each other to be closed together. Then, the projection 11 of the first die 10 is inserted into the first recess 21a' of the second die 20'. This creates the cavity between the projection 11 and the first and second recesses 21a', 21b'. The base 100", the touch sensor 300, the embedded portion 410' of the external connection 400', and the fixed portion 421' of the lead-out portion 420' of the external connection 400' are placed in the cavity. At this point, the first split faces 13, 22' of the first and second dies 10, 20' are brought into contact with each other, and the second split faces 14, 23' of the first and second dies 10, 20' hold the free portion 422' of the lead-out portion 420' therebetween.

After that, plastic material R is injected through the sprue 12 of the first die 10 onto the base 100" in the cavity. The cavity is filled with the plastic material R, so that the touch sensor 300 and the embedded portion 410' of the external connection 400' are embedded in the plastic material R on the base 100". In addition, the fixed portion 421' of the lead-out portion 420' of the external connection 400' comes into intimate contact with the plastic material R. The plastic material R hardens to form the plastic part 200. At this point, the base 100" adheres to or becomes integrated with the plastic part 200' and hardens, and the fixed portion 421' of the external connection 400' is fixed to the plastic part 200'. The portion of the plastic part 200' fixed to the base 100" forms the plastic body 210' of the plastic part 200'. The portion of the plastic part 200' fixed to the fixed portion 421' forms the protruding portion 220' of the plastic part 200'. The remaining portion of the plastic part 200' is the protruding portion 230'. This is how to insert-mold the touch sensor 300 and the embedded portion 410' of the external connection 400' in the plastic body 210' of the plastic part 200' on the base 100", affix the fixed portion 421' of the lead-out portion 420' of the external connection 400' to the protruding portion 220', and lead the free portion 422' out of the end face of the protruding portion 220'. Lastly, the first and second dies 10, 20' are separated from each other to take out the completed device module.

The above described device module has at least the following technical features and advantages. First, the embedded portion 410' of the external connection 400' is embedded in the plastic part 200' and extends along the base 100" from the touch sensor 300 to the end of the base 100". The fixed portion 421' of the lead-out portion 420' of the external connection 400' is affixed to and extends along the protruding portion 220' of the plastic part 200'. The free portion 422' of the lead-out portion 420' of the external connection 400' is led out of the end face of the protruding portion 220'. Therefore, the insert-molding process can be performed placing the base 100", the touch sensor 300 and the embedded portion 410' in the cavity of the first and second dies 10, 20', placing the fixed portion 421' along the wall of the cavity (the wall of the first recess 21a' of the second die 20'), and holding the free portion 422' of the lead-out portion 420' between the first and second dies 10, 20'. This arrangement makes it possible to manufacture the device module without inserting the lead-out portion 420' of the external connection 400' into a housing recess of a die. Moreover, the touch sensor 300 and the embedded portion 410' of the external connection 400' are affixed onto the base 100", and the fixed portion 421' is disposed along the wall of the cavity. The free portion 422' is held between the first and second dies 10, 20'. This arrangement reduces the possibility of movement of the external connection 400 if the embedded portion 410' of the external connection 400' is pressed by the plastic material R injected into the cavity.

Fourth Embodiment

Figure 7:
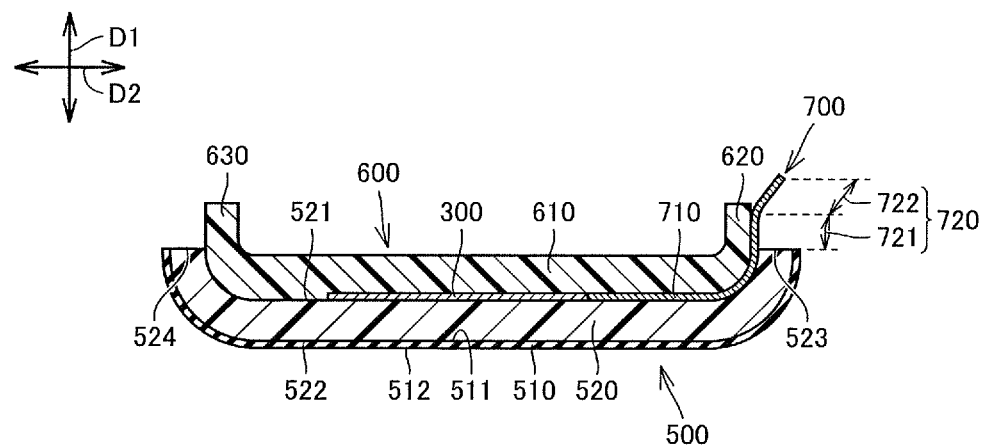
FIG. 7 is a schematic sectional view of a device module in accordance with the Fourth Embodiment of the invention.

Next, a device module in accordance with the Fourth Embodiment of the invention will be described with reference to FIG. 7. The device module shown in FIG. 7 is a touch sensing device. This device module includes a base 500, a plastic part 600, a touch sensor 300 (device), and an external connection 700. These constituents of the device module will be described below in detail. In FIG. 7, D1 refers to the thickness direction of the device module and the plastic part 600, and D2 refers to the lengthwise direction of the device module. D1 is orthogonal to D2. The short direction (not shown) of the device module is orthogonal to D1 and D2.

The base 500 includes a film 510 and a plastic block 520. The film 510 is a generally rectangular flexible film of optically transparent plastic material such as a PET (polyethylene terephthalate) film or an acrylic film. The film 510 has a first face 511 (an inner face) and a second face 512 (an outer face). Ornamental printing is provided on the entire region or a partial region (e.g., a circumferential region, or one end in the lengthwise direction D2 or in the short direction) of the first face 511 of the film 510.

The plastic block 520 is an insulating and translucent member of thermosoftening or thermosetting plastic material (e.g. polycarbonate (PC), polymethylmethacrylate (PMMA), epoxy resin, or the like). The plastic block 520 is generally of U-shape in sectional view and provided on the first face 511 of the film 510. As it is formed on the first face 511 of the film 510, the film 510 generally adheres to or is integrated with the plastic block 520 and has hardened (has lost flexibility) generally in a U-shaped curve extending along the plastic block 520. The second face 512 of the film 510 has a flat central area serving as a touch sensing surface of the device module. The plastic block 520 has a first face 521 and a second face 522 opposed to each other and end faces 523, 524. The second face 522 is affixed to the film 510. The touch sensor 300 is affixed to the center area of the first face 521 and is embedded in a plastic body 610 (to be described) of the plastic part 600. The touch sensor 300 extends substantially parallel to the touch sensing surface of the base 500. The end faces 523, 524 face upward (as shown in FIG. 7).

The plastic part 600 is an insulating member of thermosoftening or thermosetting plastic material (e.g. polycarbonate (PC), polymethylmethacrylate (PMMA), epoxy resin, or the like). The plastic part 600 is generally of U-shape in sectional view and includes the plastic body 610 and protruding portions 620, 630. The plastic body 610 of the plastic part 600 is provided on the first face 521 of the plastic block 520. The protruding portions 620, 630 are contiguous with the respective opposite ends in the lengthwise direction D2 of the plastic body 610 and extend in the thickness direction D1 (extend upward). In other words, the protruding portions 620, 630 do not exist on the first face 521 of the plastic block 520 of the plastic part 600.

The external connection 700 is flexible. Specifically, the external connection 700 is a flexible printed board or a flexible and insulating transparent film. The external connection 700 includes an embedded portion 710 and a lead-out portion 720. The embedded portion 710 of the external connection 700 is fixed onto the first face 521 of the plastic block 520 and embedded in the plastic body 610 of the plastic part 600, and it includes a lengthwise first end of the external connection 700. The first end of the external connection 700 is connected to the touch sensor 300 in a similar manner to the first end of the external connection 400 of the First Embodiment. The embedded portion 710 extends along the first face 521 of the plastic block 520, from the touch sensor 300 to the end face 523 of the plastic block 520.

The lead-out portion 720 is a portion excluding the embedded portion 710 of the external connection 700. The lead-out portion 720 has a fixed portion 721 and a free portion 722. The fixed portion 721 is contiguous with the embedded portion 710 and led out of the plastic body 610 of the plastic part 600. The fixed portion 721 is affixed to the outer face of the protruding portion 620 of the plastic part 600 and extends along the protruding portion 620. The free portion 722 is contiguous with the fixed portion 721. The free portion 722 includes a lengthwise second end of the external connection 700.

Figure 8:
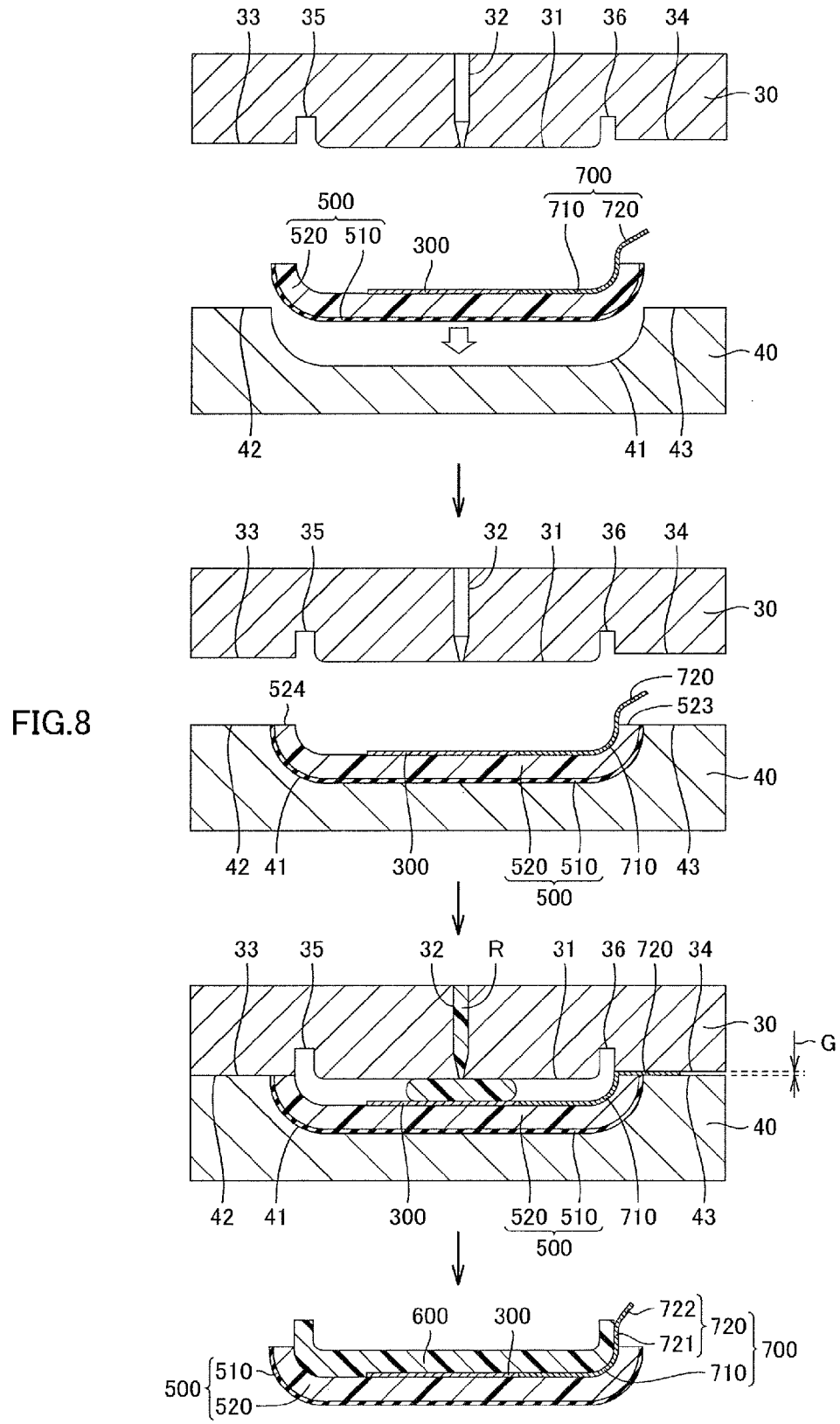
FIG. 8 is a view illustrating a manufacturing process of the device module.

The device module described above may be manufactured using first and second dies 30, 40 as illustrated in FIG. 8. The first die 30 includes a projection 31, a sprue 32, first and second split faces 33, 34, and first and second recesses 35, 36. The projection 31 projects in the thickness direction D1 (downward in FIG. 8) toward the second die 40. The sprue 32 passes through the first die 30 in the thickness direction D1. The first split face 33 is located on one side in the lengthwise direction D2 of the projection 31, and the second split face 34 is located on the other side in the lengthwise direction D2 of the projection 31. The second split face 34 is located further in the other thickness direction D1 (higher in FIG. 8) than the first split face 33 by the thickness of the lead-out portion 720 of the external connection 700. The first recess 35 is provided between the projection 31 and the first split face 33, and The second recess 36 is provided between the projection 31 and the second split face 34. The first and second recesses 35, 36 extend in the other thickness direction D1 (upward in FIG. 8).

The second die 40 includes a recess 41 and first and second split faces 42, 43. The recess 41 is adapted to receive the projection 31 and has a dimension in the thickness direction D1 (i.e. depth) larger than the dimension in the thickness direction D1 (i.e. height) of the projection 31. When the first and second dies 30, 40 are combined with each other (closed together), the recess 41 receives the projection 31. Also, the first and second recesses 35, 36 communicate with the recess 41, and the projection 31, the first and second recesses 35, 36 and the recess 41 define a space. This space serves as a cavity of the first and second dies 30, 40. The cavity is of shape conforming to the outer shape of the device module excluding the lead-out portion 720. The first split face 42 is located on the one side in the lengthwise direction D2 of the recess 41, and the second split face 43 is located on the other side in the lengthwise direction D2 of the recess 41. The first and second split faces 42, 43 extend at the same height position. When the first and second dies 30, 40 are closed together, the first split faces 33, 42 are in contact with each other, while a gap G is left between the second split faces 34, 43 corresponding to the thickness of the lead-out portion 720.

The base 500 may be manufactured in the following method using dies (not shown). First, the film 510 is placed in a cavity of the dies. After that, plastic material is injected onto the film 510 in the cavity. The plastic material hardens to form the plastic block 520. At this point, the film 510 adheres to or becomes integrated with the plastic block 520 and hardens. The plastic block 520 is thus molded on the film 510.

A method of manufacturing the device module using the first and second dies 30, 40 will be described with reference to FIG. 8. The first step is to prepare the base 500 and the touch sensor 300 with the external connection 700 connected thereto. The touch sensor 300 and the embedded portion 710 of the external connection 700 are affixed onto the first face 521 of the plastic block 520 of the base 500 with the adhesive. As a result, the embedded portion 710 extends along the plastic block 520, from the touch sensor 300 to the end of the plastic block 520, and the lead-out portion 720 protrudes from the end of the plastic block 520.

The next step is to place the base 500 into the recess 41 of the second die 40. The recess 41 accordingly receives the touch sensor 300 and the embedded portion 710 of the external connection 700 that are fixed to the base 500. As a result, the end faces 524, 523 of the plastic block 520 extend flush with the first and second split faces 42, 43 of the second die 40 and opposed to the respective parts of the first and second split faces 33, 34 of the first die 30. At this point, the lead-out portion 720 of the external connection 700 is disposed between the end face 523 of the plastic block 520 and the second split face 34 of the first die 30 and between the second split faces 34, 43 of the first and second dies 30, 40.

After that, the first and second dies 30, 40 are brought close to each other to be closed together. Then, the projection 31 of the first die 30 is received in the recess 41 of the second die 40, and the first and second recesses 35, 36 communicate with the recess 41. The projection 31, the first and second recesses 35, 36, and the recess 41 define the cavity. The base 500, the touch sensor 300, and the embedded portion 710 of the external connection 700 are placed in the cavity. At this point, the end face 524 of the plastic block 520 of the base 500 is brought into contact with a part of the first split face 33 of the first die 30, and the first split face 33, 42 of the first and second dies 30, 40 are brought into contact with each other. The fixed portion 721 of the lead-out portion 720 of the external connection 700 is held between the end face 523 of the plastic block 520 of the base 500 and the second split face 34 of the first die 30, and the free portion 722 of the lead-out portion 720 is held between the second split face 34, 43 of the first and second dies 30, 40.

After that, plastic material R is injected through the sprue 32 of the first die 30 onto the base 500 in the cavity. The cavity is filled with the plastic material R, so that the touch sensor 300 and the embedded portion 710 of the external connection 700 are embedded in the plastic material R on the base 500. This plastic material R hardens to form the plastic part 600. This is how to insert-mold the touch sensor 300 and the embedded portion 710 of the external connection 700 into the plastic part 600 on the base 500, with the lead-out portion 720 of the external connection 700 led out of the plastic part 600. After that, the first and second dies 30, 40 are separated from each other to take out the completed device module. Lastly, the fixed portion 721 is fixed to the outer face of the protruding portion 620 of the plastic part 600 with an adhesive.

The above described device module has at least the following technical features and advantages. First, the embedded portion 710 of the external connection 700 is embedded in the plastic part 600 and extends along the base 500 from the touch sensor 300 to the end face 523 of the base 500. The lead-out portion 720 of the external connection 700 is led out of the plastic part 600. Therefore, the insert-molding process can be performed placing the base 500, the touch sensor 300, and the embedded portion 710 of the external connection 700 in the cavity of the first and second dies 30, 40 while the lead-out portion 720 of the external connection 700 is held between the base 500 and the first die 30 and between the first and second dies 30, 40. This arrangement makes it possible to manufacture the device module without inserting the lead-out portion 720 of the external connection 700 into a housing recess of a die. Moreover, the touch sensor 300 and the embedded portion 710 of the external connection 700 are affixed onto the base 500, and the lead-out portion 720 of the external connection 700 is held between the base 500 and the first die 30 and between the first and second dies 30, 40. This arrangement reduces the possibility of movement of the external connection 700 if pressed by the plastic material R injected into the cavity.

Fifth Embodiment

Figure 9:
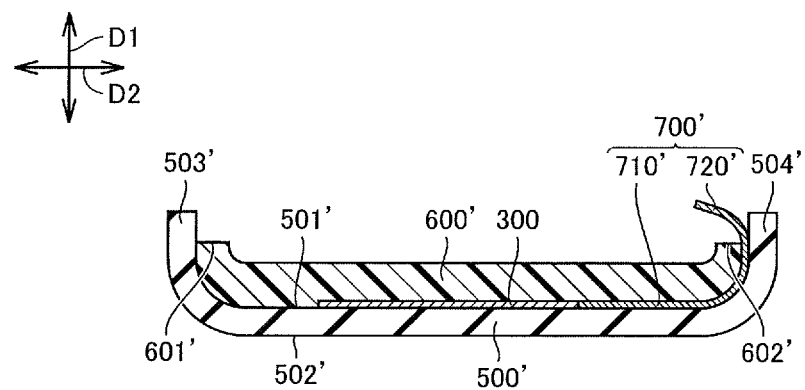
FIG. 9 is a schematic sectional view of a device module in accordance with the Fifth Embodiment of the invention.

Next, a device module in accordance with the Fifth Embodiment of the invention will be described with reference to FIG. 9. The device module shown in FIG. 9 is a touch sensing device. The device module includes a base 500', a plastic part 600', a touch sensor 300 (device), and an external connection 700'. These constituents of the device module will be described below in detail. In FIG. 9, D1 refers to the thickness direction of the device module and the plastic part 600', and D2 refers to the lengthwise direction of the device module. D1 is orthogonal to D2. The short direction (not shown) of the device module is orthogonal to D1 and D2.

The base 500' is an insulating and translucent member of thermosoftening or thermosetting plastic material (e.g. polycarbonate (PC), polymethylmethacrylate (PMMA), epoxy resin, or the like). The base 500' is generally of U-shape in sectional view and includes a first face 501' and a second face 502' opposed to each other and first and second lengthwise end portions 503', 504'. The touch sensor 300 is fixed to the flat central area of the first face 501' of the base 500' and embedded in the plastic part 600'. The second face 502' of the base 500' has a flat central area serving as a touch sensing surface of the device module. The touch sensor 300 extends substantially parallel to the touch sensing surface. End faces of the first and second end portions 503', 504' faces upward (as shown in FIG. 9).

The plastic part 600' is an insulating member of thermosoftening or thermosetting plastic material (e.g. polycarbonate (PC), polymethylmethacrylate (PMMA), epoxy resin, or the like). The plastic part 200 is generally of U-shape in sectional view and provided on the first face 501' of the base 500'. The plastic part 600' has lengthwise first and second end faces 601', 602'. The first and second end faces 601', 602' face upward. They are located at lower height position than the end faces of the end portions 503', 504' of the base 500'.

The external connection 700' is flexible. Specifically, the external connection 700' is a flexible printed board or a flexible and insulating transparent film. The external connection 700' includes an embedded portion 710' and a lead-out portion 720'. The embedded portion 710' of the external connection 700' is fixed to the first face 501' of the base 500' and embedded in the plastic part 600', and it includes a lengthwise first end of the external connection 700'. The first end of the external connection 700' is connected to the touch sensor 300 in a similar manner to the first end of the external connection 400 of the First Embodiment. The embedded portion 710' extends along the first face 501' of the base 500', from the touch sensor 300 to the second end face 602' of the plastic part 600'. The lead-out portion 720' is a portion excluding the embedded portion 710' of the external connection 700' and is led out of the second end face 602' of the plastic part 600'. The lead-out portion 720' includes a lengthwise second end of the external connection 700'.

Figure 10:
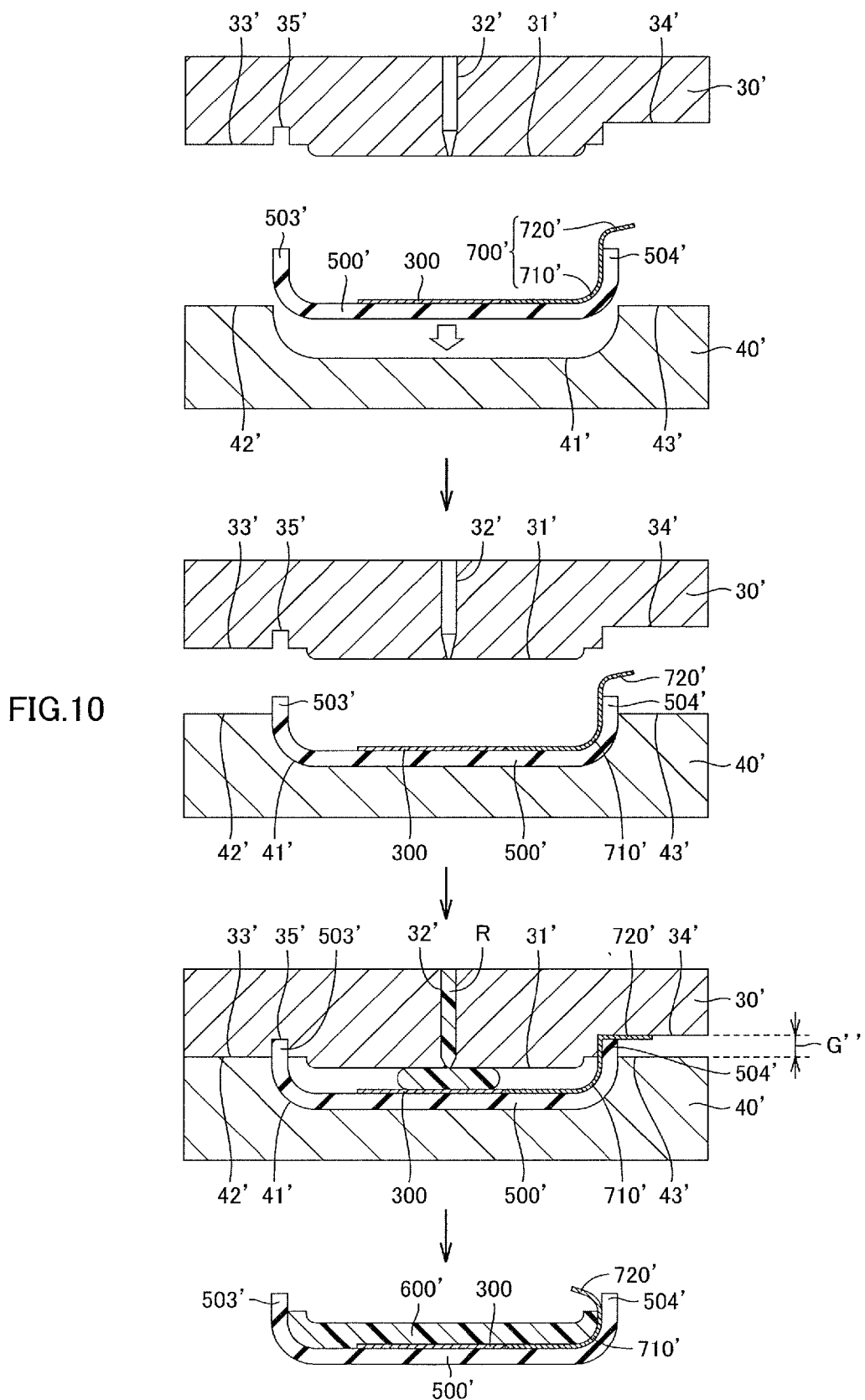
FIG. 10 is a view illustrating a manufacturing process of the device module.

The device module described above may be manufactured using first and second dies 30', 40' as illustrated in FIG. 10. The first die 30' includes a projection 31', a sprue 32', first and second split faces 33', 34', and a recess 35'. The projection 31' projects in the thickness direction D1 (downward in FIG. 10) toward the second die 40'. The sprue 32' passes through the first die 30' in the thickness direction D1. The first split face 33' is located on one side in the lengthwise direction D2 of the projection 31', and the second split face 34' is located on the other side in the lengthwise direction D2 of the projection 31'. The second split face 34' is located further to the other side of the thickness direction D1 (higher in FIG. 10) than the first split face 33' by the sum of the thickness of the lead-out portion 720' of the external connection 700' and the following distance. in the thickness direction D1 between the end face of the second end portion 504' of the base 500' and the second end face 602'. The recess 35' is provided between the projection 31' and the first split face 33' and extends to the other side in the thickness direction D1 (upward in FIG. 10). The recess 35' is of shape conforming to the outer shape of the first end portion 503' of the base 500'.

The second die 40' includes a recess 41' and first and second split faces 42', 43'. The recess 41' is adapted to receive the projection 31' and has a dimension in the thickness direction D1 (i.e. depth) larger than the dimension in the thickness direction D1 (i.e. height) of the projection 31' and substantially the same as the dimension in the thickness direction D1 of the base 500' excluding the first and second end portions 503', 504'. When the first and second dies 30', 40' are closed together, the recess 41' receives the projection 31' and communicates with the recess 35'. In this state, the projection 31', the recess 35', the recess 41', and the second end portion 504' of the base 500' define a space that serves as a cavity of the first and second dies 30', 40'. The cavity is of shape conforming to the outer shape of the device module excluding a distal portion of the lead-out portion 720' and the second end portion 504'. The first split face 42' is located on the one side in the lengthwise direction D2 of the recess 41', and the second split face 43' is located on the other side in the lengthwise direction D2 of the recess 41'. The first and second split faces 42', 43' extend at the same height position. When the first and second dies 30', 40' are closed together, the first split faces 33', 42' are in contact with each other, while a gap G'' is left between the second split faces 34', 43'. The gap G'' corresponds to the combined thickness in the thickness direction D1 of the lead-out portion 720' of the external connection 700' combined with the distance between the end face of the second end portion 504' of the base 500' and the second end face 602'.

A method of manufacturing the device module using the first and second dies 30', 40' will be described below with reference to FIG. 10. The first step is to prepare the base 500' and the touch sensor 300 with the external connection 700' connected thereto. The touch sensor 300 and the embedded portion 710' of the external connection 700' are affixed onto the first face 501' of the base 500' with an adhesive. As a result, the embedded portion 710' extends along the base 500'.

The next step is to place the base 500' into the recess 41' of the second die 40'. The first and second end portions 503', 504' of the base 500' protrude from the recess 41'. As a result, the first end portion 503' is opposed to the recess 35' of the first die 30', and the second end portion 504' is opposed to a part of the second split face 34' of the first die 30'. At this point, the basal portion of the lead-out portion 720' of the external connection 700' is disposed along the inner face of the second end portion 504' of the base 500', while the distal portion of the lead-out portion 720' is disposed between the second end portion 504' of the base 500' and the second split face 34 of the first die 30' and between the second split face 34', 43' of the first and second dies 30', 40'.

After that, the first and second dies 30', 40' are brought close to each other to be closed together. Then, the recess 41' of the second die 40' receives the projection 31' of the first die 30' and communicates with the recess 35'. Also, the first end portion 503' of the base 500' fits in the recess 35' of the first die 30', and the second end portion 504' is brought into contact via the lead-out portion 720' with a part of the second split face 34' of the first die 30'. The projection 31', the first recess 35', the recess 41', and the second end portion 504' define the cavity, and the base 500' excluding the second end portion 504', the touch sensor 300, and the embedded portion 710' of the external connection 700' are placed in the cavity. The first split faces 33', 42' of the first and second dies 30', 40' are in contact with each other. The basal portion of the lead-out portion 720' of the external connection 700' is held between the second end portion 504' of the base 500' and the first die 30'. The distal portion of the lead-out portion 720' is held between the second end portion 504' of the base 500' and the second split face 34' of the first die 30'.

After that, plastic material R is injected through the sprue 32' of the first die 30' onto the base 500'. The cavity is filled with the plastic material R, so that the touch sensor 300 and the embedded portion 710' of the external connection 700' are embedded in the plastic material R on the base 500'. This plastic material R hardens to form the plastic part 600'. This is how to insert-mold the touch sensor 300 and the embedded portion 710' of the external connection 700' in the plastic part 600' on the base 500', with the lead-out portion 720' of the external connection 700' led out of the plastic part 600'. Lastly, the first and second dies 30', 40' are separated from each other to take out the completed device module.

The above described device module has at least the following technical features and advantages. First, the embedded portion 710' of the external connection 700' is embedded in the plastic part 600' and extends along the base 500' from the touch sensor 300 to the second end face 602' of the plastic part 600'. The lead-out portion 720' of the external connection 700' is led out of the plastic part 600'. Therefore, the insert-molding process can be performed placing the base 500' excluding the second end portion 504', the touch sensor 300, the embedded portion 710' of the external connection 700' in the cavity of the first and second dies 30', 40' and holding the lead-out portion 720' of the external connection 700' between the second end portion 504' of the base 500' and the first die 30'. This arrangement makes it possible to manufacture the device module without inserting the lead-out portion 720' of the external connection 700' into a housing recess of a die. Moreover, the touch sensor 300 and the embedded portion 710' of the external connection 700' are affixed onto the base 500', and the lead-out portion 720' of the external connection 700' is held between the base 500' and the first die 30'. This arrangement reduces the possibility of movement of the external connection 700' if pressed by the plastic material R injected into the cavity.

Sixth Embodiment

Figure 11:
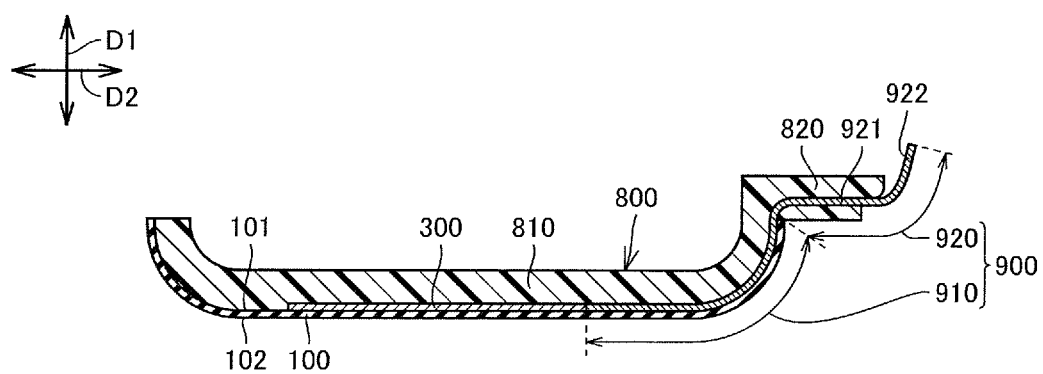
FIG. 11 is a schematic sectional view of a device module in accordance with the Sixth Embodiment of the invention.

Next, a device module in accordance with the Sixth Embodiment of the invention will be described with reference to FIG. 11. The device module shown in FIG. 11 has the same configuration as that of the First Embodiment, except that a plastic part 800 and an external connection 900 are provided in place of the plastic part 200 and the external connection 400, respectively. These differences will be described below in detail, and overlapping descriptions will be omitted. FIG. 11 also indicates the directions D1 and D2.

The plastic part 800 is an insulating member of thermo-softening or thermosetting plastic material (e.g. polycarbonate (PC), polymethylmethacrylate (PMMA), epoxy resin, or the like). The plastic part 800 includes a plastic body 810 and a protecting part 820. The plastic body 810 is generally U-shaped in sectional view. The plastic body 810 is provided on the first face 101 of the base 100. This causes the base 100 generally adhere to or be integrated with the plastic body 810 and harden (have lost flexibility) generally in a U-shaped curve extending along the plastic body 810. The touch sensor 300 is affixed onto the center area of the first face 101 of the base 100 and is embedded in the plastic body 810. The flat central area of the second face 102 of the base 100 serves as the touch sensing surface of the device module. The touch sensor 300 extends substantially parallel to the touch sensing surface. The protecting part 820 is a generally rectangular block contiguous with a lengthwise end of the plastic body 810 and extends in the lengthwise direction D2.

The external connection 900 is flexible. Specifically, the external connection 900 is a flexible printed board or a flexible and insulating transparent film. The external connection 900 includes an embedded portion 910 and a lead-out portion 920. The embedded portion 910 of the external connection 900 is fixed onto the first face 101 of the base 100 and embedded in the plastic body 810 of the plastic part 800, and it includes a lengthwise first end of the external connection 900. The first end of the external connection 900 is connected to the touch sensor 300 in a similar manner to the first end of the external connection 400 of the First Embodiment. The embedded portion 910 extends along the first face 101 of the base 100, from the touch sensor 300 to an end of the base 100.

The lead-out portion 920 is a portion excluding the embedded portion 910 of the external connection 900 and extends through and out of the protecting part 820. The lead-out portion 920 includes a fixed portion 921 and a free portion 922. The fixed portion 921 is contiguous with the embedded portion 910 and embedded in the protecting part 820. That is, the protecting part 820 covers the fixed portion 921 of the lead-out portion 920. The free portion 922 is contiguous with the fixed portion 921 and led out of the protecting part 820. The free portion 922 includes a lengthwise second end of the external connection 700.

Figure 12:
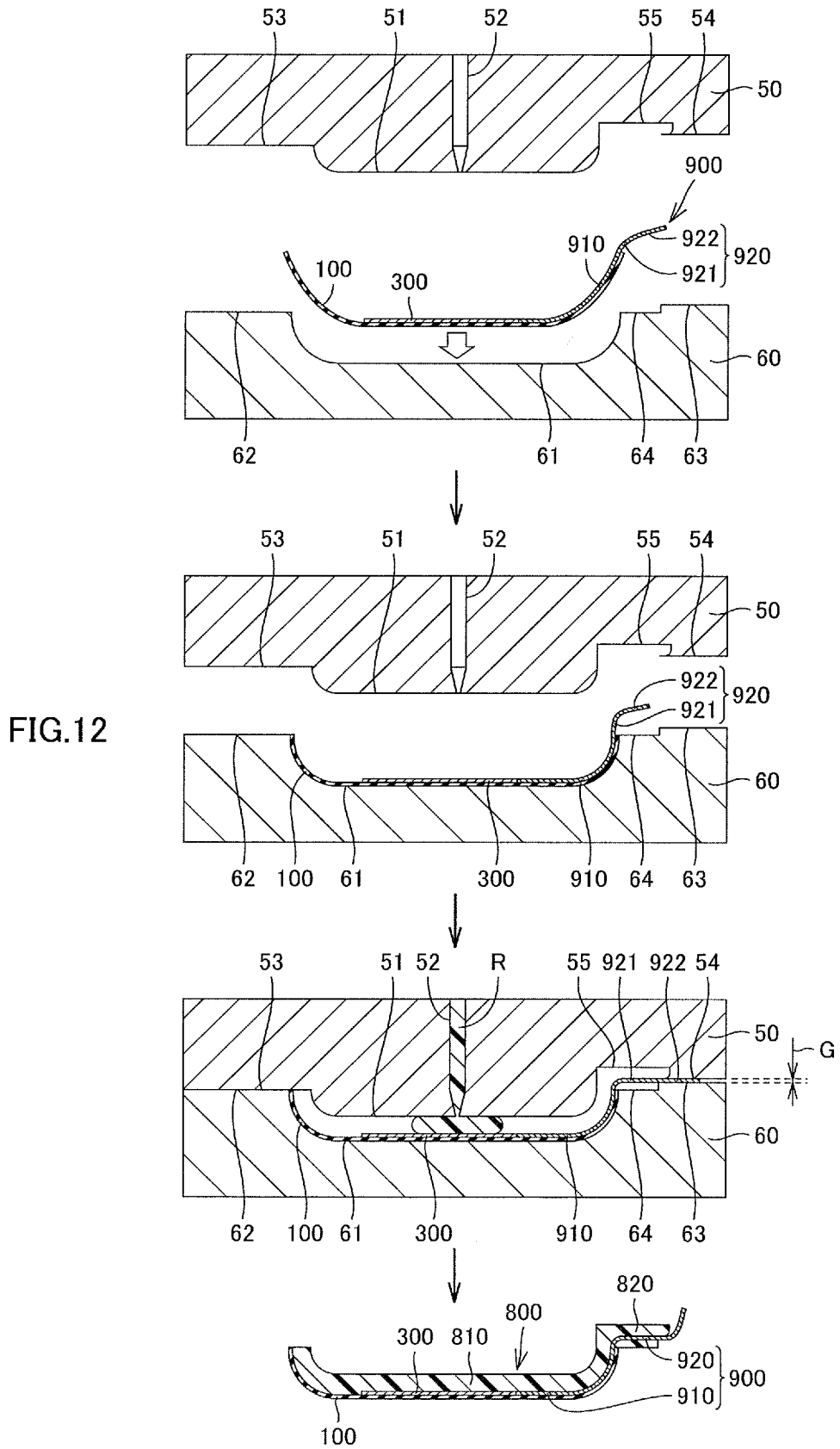
FIG. 12 is a view illustrating a manufacturing process of the device module.

The device module described above may be manufactured using first and second dies 50, 60 as illustrated FIG. 12. The first die 50 includes a projection 51, a sprue 52, first and second split faces 53, 54, and a recess 55. The projection 51 of the first die 50 projects in the thickness direction D1 (downward in FIG. 12). The sprue 52 passes through the first die 50 in the thickness direction D1. The first split face 53 is located on one side in the lengthwise direction D2 of the projection 51, and the second split face 54 is located on the other side in the lengthwise direction D2 of the projection 51. The second split face 54 is located further to the other side of the thickness direction D1 (higher in FIG. 12) than the first split face 53 by the thickness of the lead-out portion 920 of the external connection 900. The recess 55 is provided between the projection 51 and the second split face 54.

The second die 60 includes a recess 61, first and second split faces 62, 63, and a recess 64. The recess 61 is adapted to receive the projection 51 and has a dimension in the thickness direction D1 (i.e. depth) larger than the dimension in the thickness direction D1 (i.e. height) of the projection 51. When the first and second dies 50, 60 are closed together, the recess 61 receives the projection 51 and communicates with the recesses 55 and 64. The projection 51, the recess 55, the recess 61, and the recess 64 define a space that serves as a cavity of the first and second dies 50, 60. The cavity is of shape conforming to the outer shape of the device module excluding the free portion 922 of the lead-out portion 920. The cavity includes a space defined by the recess 55 and the recess 64, and this space conforms to the outer shape of the protecting part 820. The first split face 62 is located on the one side in the lengthwise direction D2 of the recess 61, and the second split face 63 is located on the other side in the lengthwise direction D2 of the recess 61. The first and second split faces 62, 63 extend at the same height position. When the first and second dies 50, 60 are closed together, the first split face 53, 62 are in contact with each other, while a gap G is left between the second split faces 54, 63 corresponding to the thickness of the lead-out portion 920.

A method of manufacturing the device module using the first and second dies 50, 60 will be described below with reference to FIG. 12. The first step is to prepare the base 100 and the touch sensor 300 with the external connection 900 connected thereto. The touch sensor 300 and the embedded portion 910 of the external connection 900 are affixed onto the first face 101 of the base 100 with an adhesive. As a result, the embedded portion 910 extends along the base 100 from the touch sensor 300 to the end of the base 100, and the lead-out portion 920 protrudes from the end of the base 100.

The next step is to place the base 100, the touch sensor 300 and the embedded portion 910 of the external connection 900 into the recess 61 of the second die 60. This causes the base 100 to curve generally in U-shape in sectional view conforming to the shape of the wall of the recess 61, and the embedded portion 910 is accordingly curved. In addition, the fixed portion 921 of the lead-out portion 920 of the external connection 900 is disposed between the recesses 55 and 64, and the free portion 922 is disposed between the second split faces 54, 63 of the first and second dies 50, 60.

After that, the first and second dies 50, 60 are brought close to each other to be closed together. Then, the recess 61 of the second die 60 receives the projection 51 of the first die 50 and communicates with the recesses 55, 64. Consequently, the projection 51, the recess 55, the recess 61, and the recess 64 define the cavity, the cavity, and the base 100, the touch sensor 300, and the embedded portion 910 of the external connection 900 are placed in the cavity. At this point, the first split faces 53, 62 of the first and second dies 50, 60 are in contact with each other. The free portion 922 of the lead-out portion 920 of the external connection 900 is held between the second split faces 54, 63 of the first and second dies 50, 60, and the fixed portion 921 is disposed in midair in the space defined by the recesses 55, 64 in the cavity.

After that, plastic material R is injected through the sprue 52 of the first die 50 onto the base 100 in the cavity. The cavity is filled with the plastic material R, so that the touch sensor 300 and the embedded portion 910 of the external connection 900 are embedded in the plastic material R on the base 100, and the fixed portion 921 of the lead-out portion 920 is also embedded in the plastic material R. The plastic material R hardens to form the plastic part 800. At this point, the base 100 adheres to or becomes integrated with the plastic body 810 of the plastic part 800 and hardens. This is how to insert-mold the touch sensor 300 and the embedded portion 910 of the external connection 900 in the plastic body 810 of the plastic part 800 on the base 100, with the lead-out portion 920 of the external connection 900 passing through and out of the protecting part 820 of the plastic part 800. Lastly, the first and second dies 50, 60 are separated from each other to take out the completed device module.

The above described device module has at least the following technical features and advantages. First, the embedded portion 910 of the external connection 900 is embedded in the plastic part 800 and extends along the base 100 from the touch sensor 300 to the end of the base 100. The lead-out portion 920 of the external connection 900 passes through and is led out of the protecting part 820 of the plastic part 800. Therefore, the insert-molding process can be performed placing the base 100, the touch sensor 300, and the embedded portion 910 and the fixed portion 921 of the external connection 900 in the cavity of the first and second dies 50, 60 while the first and second dies 50, 60 hold therebetween the free portion 922 of the lead-out portion 920 of the external connection 900. This arrangement makes it possible to manufacture the device module without inserting the lead-out portion 920 of the external connection 900 into a housing recess of a die. Moreover, the touch sensor 300 and the embedded portion 910 of the external connection 900 are affixed onto the base 100, and the lead-out portion 920 of the external connection 900 is held between the first and second dies 50, 60. This arrangement reduces the possibility of movement of the external connection 900 if pressed by the plastic material R injected into the cavity. Further advantageously, the fixed portion 921 of the lead-out portion 920 is embedded in the protecting part 820, improving the tensile strength of the lead-out portion 920.

Seventh Embodiment

Next, a device module in accordance with the Seventh Embodiment of the invention will be described with reference to FIG. 13. The device module in FIG. 13 has the same configuration as that of the Sixth Embodiment except for the following two differences. The first difference is that a plastic part 800' and an external connection 900' are provided in place of the plastic part 800 and the external connection 900. The second difference is that the device module further includes a protecting part 1000. The differences will be described below in detail, and descriptions overlapping with the Sixth Embodiment will be omitted.

The plastic part 800' has substantially the same configuration as that of the plastic part 800. The difference is that the plastic part 800' includes a projection 820' in place of the protecting part 820. The projection 820' is contiguous with a lengthwise end of the plastic body 810' and extends upward. The protecting part 1000 is a rectangular insulating plastic block affixed to the projection 820'.

The external connection 900' has substantially the same configuration as that of the external connection 900, except that it includes a lead-out portion 920' passing through and out of the protecting part 1000. In other words, the protecting part 1000 covers the fixed portion 921' of the lead-out portion 920'. The fixed portion 921' of the lead-out portion 920' is contiguous with the embedded portion 910' and is embedded in the protecting part 1000. The free portion 922' of the lead-out portion 920' is contiguous with the fixed portion 921' and led out of the protecting part 1000.

Figure 14:
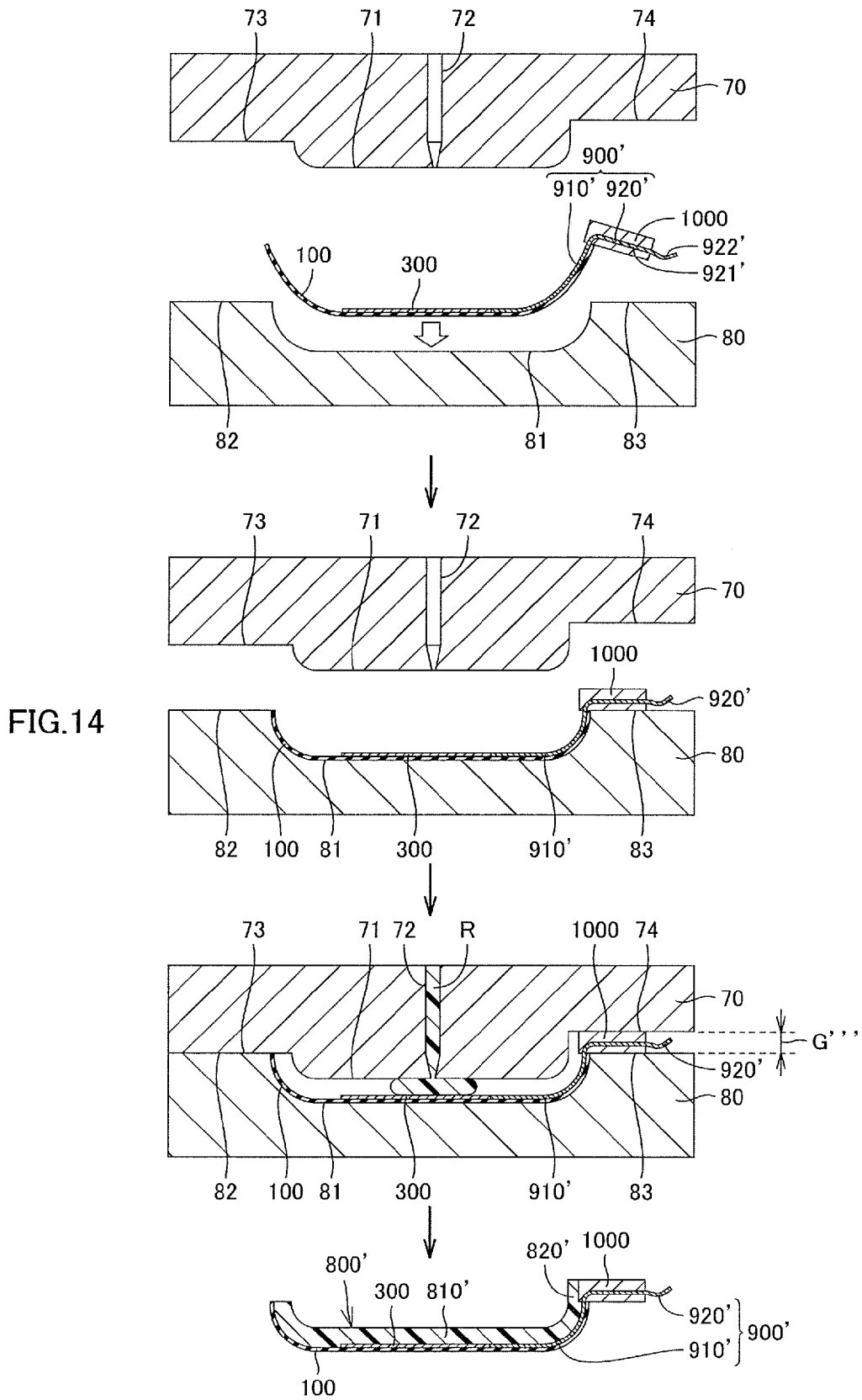
FIG. 14 is a view illustrating a manufacturing process of the device module.
Figure 15:
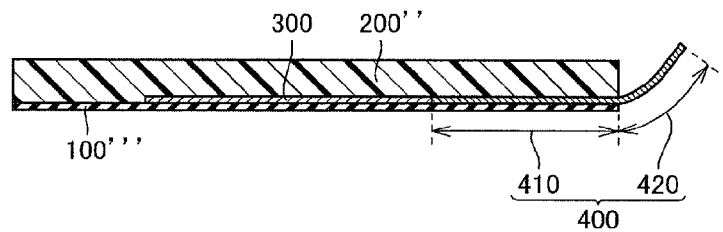
FIG. 15 is a schematic sectional view of a device module in accordance with a first example modification of the First Embodiment.
Figure 16:
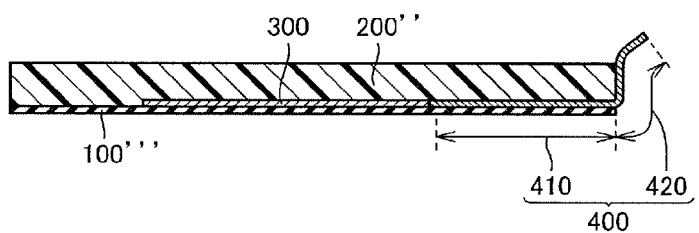
FIG. 16 is a schematic sectional view of a device module in accordance with a second example modification of the First Embodiment.
Figure 17:
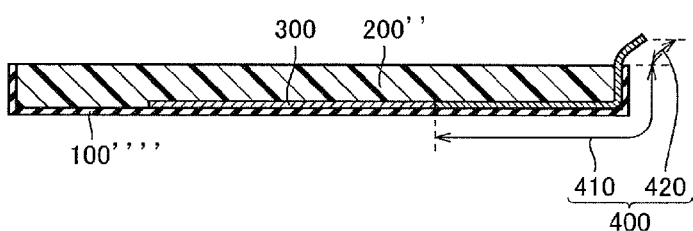
FIG. 17 is a schematic sectional view of a device module in accordance with a third example modification of the First Embodiment.

The device module described above may be manufactured using first and second dies 70, 80 as illustrated FIG. 14. The first die 70 has substantially the same configuration as that of the first die 10, except for the height of a second split face 74. More particularly, the second split face 74 is located further to the other side of the thickness direction D1 (higher in FIG. 14) than the first split face 73 by the thickness of the protecting part 1000. The second die 80 has the same configuration as the second die 20. When the first and second dies 70, 80 are closed together, the first split face 73, 82 are in contact with each other, while a gap G''' is left between the second split faces 74, 83. The gap G''' corresponds to the thickness of the protecting part 1000. The cavity of the first and second dies 70, 80 is of shape conforming to the outer shape of the device module excluding the protecting part 1000 and the lead-out portion 920'.

The fixed portion 921' of the lead-out portion 920' of the external connection 900' may be embedded in the protecting part 1000 in the following method using dies (not shown). First, the external connection 900' is prepared. The external connection 900' may or may not be connected to the touch sensor 300. The fixed portion 921' of the lead-out portion 920' of the external connection 900' is placed in the cavity of the dies, and plastic material is injected into the cavity. As a result, the fixed portion 921' of the lead-out portion 920' of the external connection 900' is embedded (insert-molded) in the plastic material. The hardened plastic material forms the protecting part 1000. This is how to provide the protecting part 1000' in such a manner as to partially cover the lead-out portion 920'.

A method of manufacturing the device module using the first and second dies 70, 80 will be described below with reference to FIG. 14. The first step is to prepare the base 100 and the touch sensor 300 with the external connection 900' connected thereto. Also prepared is the protecting part 1000 provided on the lead-out portion 920' of the external connection 900'. The touch sensor 300 and the embedded portion 910' of the external connection 900' are fixed onto the first face 101 of the base 100 with an adhesive. As a result, the embedded portion 910' extends along the base 100 from the touch sensor 300 to the end of the base 100, and the lead-out portion 920' protrudes from the end of the base 100. The protecting part 1000 is disposed near the end of the base 100.

The next step is to place the base 100, the touch sensor 300, and the embedded portion 910' of the external connection 900' into the recess 81 of the second die 80. This causes the base 100 to curve generally in U-shape in sectional view conforming to the shape of the wall of the recess 81, and the embedded portion 910' is accordingly curved. In addition, the protecting part 1000 is disposed between the second split face 74, 83 of the first and second dies 70, 80.

After that, the first and second dies 70, 80 are brought close to each other to be closed together. Then, the projection 71 of the first die 70 is received in the recess 81 of the second die 80. Consequently, the projection 71 and the recess 81 form the cavity, and the base 100, the touch sensor 300, and the embedded portion 910' of the external connection 900' are placed in the cavity. At this point, the first split faces 73, 82 of the first and second dies 70, 80 are in contact with each other. The protecting part 1000 is held between the second split faces 74, 83 of the first and second dies 70, 80, and a part of the protecting part 1000 (the left end in FIG. 14) is disposed in the cavity.

After that, plastic material R is injected through the sprue 72 of the first die 70 onto the base 100 in the cavity. The cavity is filled with the plastic material R, so that the touch sensor 300 and the embedded portion 910' of the external connection 900' are embedded in the plastic material R on the base 100, and the plastic material R adheres to the above-mentioned part of the protecting part 1000. The plastic material R hardens to form the plastic part 800'. At this point, the base 100 adheres to or becomes integrated with the plastic body 810' of the plastic part 800' and hardens. This is how to insert-mold the touch sensor 300 and the embedded portion 910' of the external connection 900' in the plastic body 810' of the plastic part 800' on the base 100. Also, the projection 820' of the plastic part 800' is fixedly attached to the protecting part 1000, and the lead-out portion 920' of the external connection 900' passes through and out of the protecting part 1000. Lastly, the first and second dies 70, 80 are separated from each other to take out the completed device module.

The above described device module has at least the following technical features and advantages. First, the embedded portion 910' of the external connection 900' is embedded in the plastic part 800' and extends along the base 100 from the touch sensor 300 to the base 100. The lead-out portion 920' of the external connection 900' passes through and is led out of the protecting part 1000 fixed to the plastic part 800'. Therefore, the insert-molding process can be performed placing the base 100, the touch sensor 300 and the embedded portion 910' of the external connection 900' in the cavity of the first and second dies 70, 80 while the first and second dies 70, 80 hold the protecting part 1000 therebetween. This arrangement makes it possible to manufacture the device module without inserting the lead-out portion 920' of the external connection 900' into a housing recess of a die. Moreover, the touch sensor 300 and the embedded portion 910' of the external connection 900' are fixed onto the base 100, the first and second dies 70, 80 hold therebetween the protecting part 1000, and the lead-out portion 920' of the external connection 900' passes through and out of the protecting part 1000. This arrangement reduces the possibility of movement of the external connection 900' if pressed by the plastic material R injected into the cavity. Further advantageously, the protecting part 1000 is held between the first and second dies 70, 80, making it possible to protect the lead-out portion 920' of the external connection 900' against the first and second dies 70, 80. Further, the fixed portion 921' of the lead-out portion 920' is embedded in the protecting part 1000 and the protecting part 1000 is fixed to the plastic part 800', improving the tensile strength of the lead-out portion 920'.

The device module of the invention is not limited to the embodiments as described above and may be modified in any manner within the scope of claims. Specific modifications will be described with reference to FIG. 15 to FIG. 21.

In the First to the Third Embodiments and the Sixth to the Seventh Embodiments, the base is a transparent film. In the Fourth Embodiment, the base includes a film and a plastic block. In the Fifth Embodiment, the base is made of thermosoftening or thermosetting plastic material. However, the base of the invention may be modified in any manner as long as the base has a face provided with the plastic part, a device (to be described) is provided on the face, and the embedded portion of the external connection extends along the face. For example, the base of any of the First to Third, Sixth and Seventh Embodiments may be replaced with the base of the Fourth or Fifth Embodiment. Conversely, the base of the Fourth or Fifth Embodiment may be replaced with the base of any of the First to Third, Sixth and Seventh Embodiments. Any of these bases may be a film or plastic block with a hard coat, an adhesive layer, an anti-reflection layer, and/or a polarizing plate.

The base may be U-shaped in sectional view as in the First to Third, Sixth and Seventh Embodiments, but it is not limited to this. For example, the base may be of flat shape like a base 100''' shown in FIG. 15 and FIG. 16. The base may also be configured like a base 100''' shown in FIG. 17, including a flat horizontal portion and a pair of vertical portions contiguous with the ends of the horizontal portion and bent at right angles to the horizontal portion. The base of the First to Third, Sixth and Seventh Embodiments may be modified to be arc-shaped. The base of the Fourth and Fifth Embodiments may be also modified to be of flat shape, of shape including a horizontal portion and vertical portions, or be arc-shaped. Further, the base may be formed of a film that does not harden (does not lose flexibility) after the formation of the plastic material. The base may be provided with ornamental printing as in the above embodiments, or it may be provided without ornamental printing. The base may be made of an opaque material.

Translucent material is used for the plastic block of the Fourth Embodiment and the base of the Fifth Embodiment. However, a plastic material with no translucency may be used.

Figure 19:
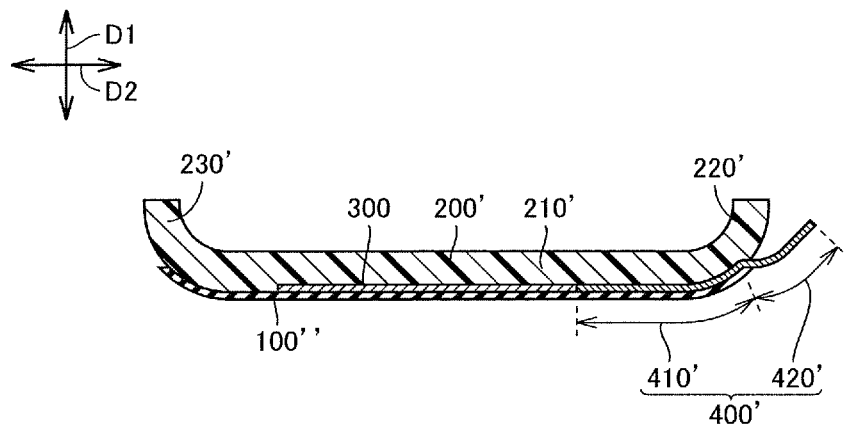
FIG. 19 is a schematic sectional view of a device module in accordance with a first example modification of the Third Embodiment.

The external connection of the invention may be modified in any manner as long as it is connected to a device (to be described) and includes an embedded portion, which extends along the base and is embedded in the plastic part, and a lead-out portion, which is contiguous with the embedded portion and led out of the plastic part. The lead-out portion may be led out of a portion other than the end face of the plastic part. For example, FIG. 19 shows a modified lead-out portion 420' that is not fixed to the outer face of the protruding portion 220' of the plastic part 200' but led out of a curved face of the protruding portion 220'.

The external connection may be a flexible printed board or a flexible and insulating transparent film as in the First to the Seventh Embodiments and the modifications described above. However, the external connection is not limited to these. For example, the external connection may be a lead wire, a header pin, or a rigid board. The external connection may include a film and a conductive line. In this case, the film may be contiguous with the base of any of the First to Third, Sixth and Seventh Embodiments, and the conductive line may be printed on the base and the film. The conductive line on the base may serve as an embedded portion, and the film and the conductive line on the film may serve as a lead-out portion.

The plastic material may be an insulating thermosoftening or thermosetting plastic material as in the First to the Seventh Embodiments. However, the plastic material of the invention may be any insulating plastic material that can be provided on the base and adapted to embed therein a device (a sensor, an electronic device, or a circuit board) and an embedded portion of an external connection. The plastic material may be of U-shape in sectional view or any other shape. For example, the plastic part may have a flat shape, like the plastic part 200" shown in FIG. 15 to FIG. 17, or an arc shape.

The protecting part 820 of the Sixth Embodiment is a plastic block contiguous with an end of the plastic body 810, and the lead-out portion 920 passes through and out of the protecting part 820. The protecting part 1000 of the Seventh Embodiment is a plastic block, and the lead-out portion 920' passes through and out of the protecting part 1000. However, the protecting part may be modified in any manner as long as it partially covers the lead-out portion. The protecting part may be made of any other material that allows the lead-out portion of the external connection to pass therethrough, i.e. any plastic material such as an elastomer, metal, or ceramic. The protecting part may have a through hole for passing the lead-out portion therethrough, thereby letting the lead-out portion pass through the protecting part. The protecting part may be a film, a film coating, or an adhesive provided on the fixed portion of the lead-out portion. The protecting part may include a plurality of pieces that can be fixed to the fixed portion of the lead-out portion surrounding the fixed portion. The protecting part may cover only one face of the fixed portion of the lead-out portion.

Figure 20:
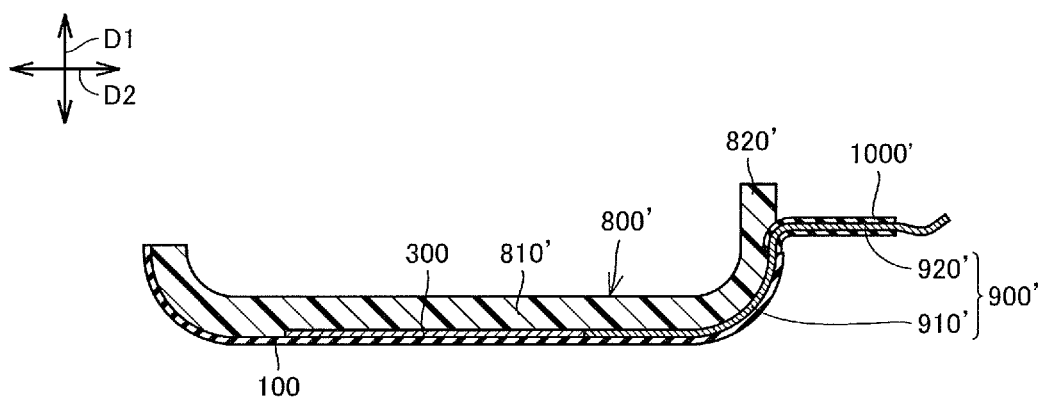
FIG. 20 is a schematic sectional view of a device module in accordance with a first example modification of the Seventh Embodiment.

The protecting part may be a film configured like a protecting part 1000' shown in FIG. 20. This modified protecting part 1000' is a plastic film or a copper foil that is stuck or applied to the fixed portion of the lead-out portion 920' so as to cover the fixed portion of the lead-out portion 920' of the external connection 900'. In this case, the first and second dies 70, 80 may be modified to provide such a distance between the second split faces 74, 83 as to hold the protecting part 1000' between the second split faces 74, 83 when the first and second dies 70, 80 are closed together.

Figure 13:
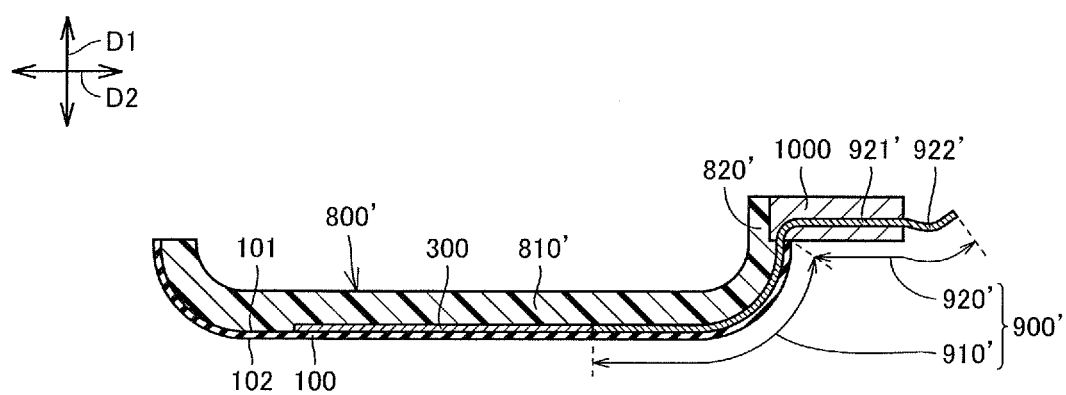
FIG. 13 is a schematic sectional view of a device module in accordance with the Seventh Embodiment of the invention.
Figure 21:
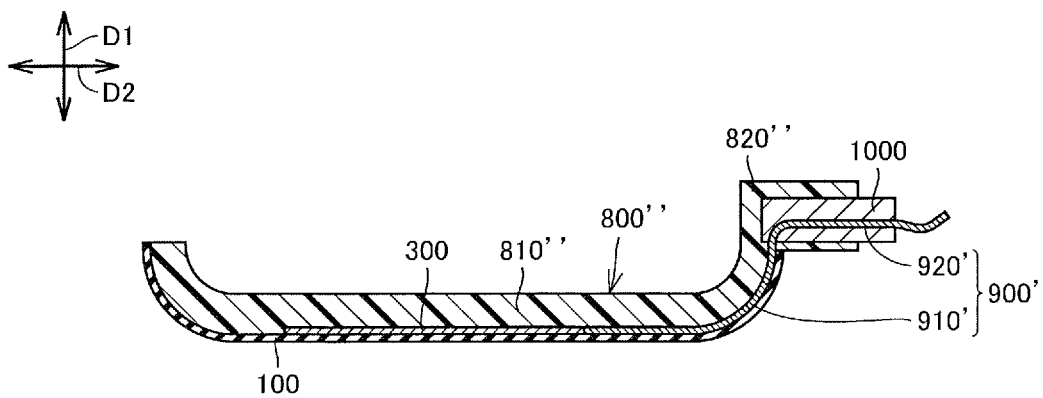
FIG. 21 is a schematic sectional view of a device module in accordance with a second example modification of the Seventh Embodiment.

The protecting part 1000 of the Seventh Embodiment is fixed to the projection 820' of the plastic part 800' at its left end as shown in FIG. 13. However, the protecting part of the invention may be fixed to the plastic part in any manner. For example, FIG. 21 illustrates a modified protecting part 1000 having a part embedded in a projection 820" of a plastic part 800" such that the outer circumference of the protecting part 1000 is surrounded by the projection 820". In this case, the first and second dies 70, 80 may be modified to provide a cavity of shape conforming to the shape of the projection 820".

The device of the device module may be a touch sensor used as a capacitive touch panel as in the First to Seventh Embodiments and the modifications described above. However, the device of the invention may be any type of sensor, any type of electronic component, or any type of circuit board. The sensor may be of any type including a touch panel of type other than the capacitive type (for example, a touch panel of resistive film-type, optical-type, ultrasonic-type, or in-cell type), a touch switch (for example, a touch switch of capacitive, resistive film-type, optical-type, ultrasonic-type, or in-cell type), or a sensor other than the touch panel and the touch switch (for example, a magnetic sensor, an optical sensor, or a light-dark sensor) can be used. In the touch panel and the touch switch (touch sensor), the electrode may be provided on the base by any well-known printing method. The touch panel and the touch switch may be opaque. The touch sensing surface of the touch panel or the touch switch is not limited to the second surface of the base. For example, the touch sensing surface may be an outer surface of a panel provided on the side of the outer surface of the base. Also, an electronic component or a circuit board in place of a sensor may be embedded in the plastic part. Examples of the electronic component include active components (for example, semiconductor) and passive components (for example, a resistor, a capacitor, and a coil).

The touch sensor may be fixed directly onto the base as in the First to Seventh Embodiments. The device may be indirectly provided on the base via a spacer or the like.

Figure 18:
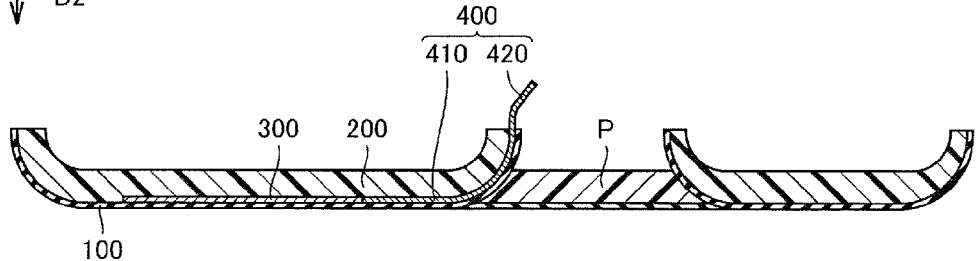
FIG. 18 is a schematic sectional view of a device module in accordance with a fourth example modification of the First Embodiment.

The device module may be a touch sensing device as in the First to Seventh Embodiments and the modifications described above. The device module may be modified to a window part of a panel P of a touch sensing device as shown in FIG. 18.

The device module manufacturing methods of the First to Seventh Embodiments may be modified such that the touch sensor 300 is replaced with a device described above. In the device module manufacturing methods of the First to the Seventh Embodiment, the touch sensor and the embedded portion of the external connection are affixed onto the base. However, the manufacturing methods of the invention may be modified such that only the device is affixed onto the base. In this case, the embedded portion may be merely placed on the base. In the device module manufacturing methods of the First to Third Embodiments, the lead-out portion of the external connection is held entirely between the first and second dies. However, the manufacturing methods of the invention are not limited to this and may be modified as follows. For example, the lead-out portion may be held between the base and the first die and between the first and second dies as in the Fourth Embodiment. Alternatively, the lead-out portion may be held between the base and the first die as in the Fifth Embodiment. Further alternatively, a part of the lead-out portion may be placed in the cavity while the remaining portion thereof may be held between the first and second dies as in the Sixth Embodiment. Still alternatively, the lead-out portion may not be held between the base and the first die and/or between the first and second dies. Instead, the lead-out portion may be provided with a protecting part for partially covering the lead-out portion, and the protecting part may be held between the base and the first die and/or between the first and second dies. The manufacturing methods can also be modified such that the protecting part is not placed in the cavity or that the protecting part is not fixed to the plastic material injected into the cavity.

In the device module manufacturing methods of the First to the Seventh Embodiments, the embedded portion of the external connection connected to the touch sensor is fixed on the base. However, the manufacturing methods can be modified such that the device is fixed to the base before the embedded portion of the external connection is connected to the device and fixed or mounted on the base.

The cavity of the first and second dies may be of any shape if conforming to the outer shape of the device module excluding at least a part of the lead-out portion, excluding a part of the plastic part and the lead-out portion, or excluding the protecting part and the lead-out portion. For example, the first and second dies may be modified to have recesses that forms a cavity when where the first and second dies are closed together. Alternatively, a projection provided on the second die may be inserted into a recess provided in the first die, and the projection and the recess form a cavity. The sprue may be provided in at least one of the first and second dies.

In the First to the Seventh Embodiments, the second split face of the first die is located higher than the first split face of the first die to form the gap G, G', G", or G'". However, the gap G, G', G" or G'" may be formed by locating the second split face of the second die lower than the first split face of the second die. Alternatively, the gap G, G', G", or G'" may be formed by locating the second split face of the first die higher than the first split face of the first die and locating the second split face of the second die lower than the first split face of the second die.

It should be appreciated that the above-described embodiments and modifications are described by way of examples only. The materials, shapes, dimensions, numbers, arrangements, and other configurations of the device module and the first and second dies may be modified as long as they provide the same functions.

REFERENCE SIGNS LIST

First Embodiment

10: first die
20: second die
R: plastic material
100: base
101: first face
102: second face
200: plastic part
300: touch sensor (device)
400: external connection
410: embedded portion
420: lead-out portion Second Embodiment 10': first die
20: second die
R: plastic material
100': base
101': first face
102': second face
110': base body
120': affixed portion
200: plastic material
300: touch sensor (device)
400: external connection
410: embedded portion
420: lead-out portion Third Embodiment 10: first die
20': second die
R: plastic material
100": base
101": first face
102": second face
200': plastic part
210': plastic body
220': protruding portion
230': protruding portion
300: touch sensor (device)
400': external connection
410': embedded portion
420': lead-out portion
421': fixed portion
422': free portion Fourth Embodiment 30: first die
40: second die
R: plastic material
500: base
510: film
520: block
600: plastic part
610: plastic body
620: protruding portion
630: protruding portion
300: touch sensor (device)
700: external connection
710: embedded portion
720: lead-out portion
721: fixed portion
722: free portion Fifth Embodiment 30': first die
40': second die
R: plastic material
500': base
600': plastic part
300: touch sensor (device)
700': external connection 710': embedded portion
720': lead-out portion Sixth Embodiment 50: first die
60: second die
R: plastic material
100: base
800: plastic part
810: plastic body
820: protecting part
300: touch sensor (device)
900: external connection
910: embedded portion
920: lead-out portion
921: fixed portion
922: free portion Seventh Embodiment 70: first die
80: second die
R: plastic material
100: base
800': plastic part
810': plastic body
820': projection
300: touch sensor (device)
900': external connection
910': embedded portion
920': lead-out portion
921': fixed portion
922': free portion
1000: protecting part

The invention claimed is:

1. A device module comprising:
    a base;
    a plastic part provided on the base;
    a device provided on the base and embedded in the plastic part, the device being a capacitive touch panel or a capacitive touch switch;
    a protecting part being a rectangular insulating plastic block affixed to the plastic part; and
    an external connection, the external connection including:
        an embedded portion being connected to the device, extending from the device to an end of the base on and along the base such as to follow a shape of the base, and being embedded in the plastic part, and
        a lead-out portion being contiguous with the embedded portion and led out of the plastic part so as to be located outside the plastic part, wherein the lead-out portion includes at least a first part and a second part, wherein the first part of the lead-out portion is embedded in the protecting part, wherein the second part of the lead-out portion is not contained by the device module.

2. The device module according to claim 1, wherein the base comprises at least one of a film and a plastic material.

3. The device module according to claim 1, wherein the external connection is of film shape to be provided integrally with the touch panel or touch switch.

4. A method of manufacturing the device module according to claim 1, the method comprising:
    preparing the external connection, the device, the protecting part, and the base, the external connection including the embedded portion and the lead-out portion, and the device being the sensor, the electronic device, or the circuit board and connected to the embedded portion, and the protecting part partially covering the lead-out portion;
    affixing the device and the embedded portion of the external connection onto the base;
    placing the base, the device, and the embedded portion of the external connection into a cavity of first and second dies, and holding the protecting part between the first and second dies or between the first die and the base; and
    in this state, injecting a plastic material onto the base in the cavity to insert-mold the device and the embedded portion of the external connection in the plastic material,
    wherein the holding of the protecting part includes disposing a part of the protecting part in the cavity, and
    wherein the injection of the plastic material includes affixing the part of the protecting part to the plastic material injected in the cavity.

5. The device module according to claim 1, wherein
    the plastic part is molded plastic material that has been molded on the base,
    the device is insert-molded in the plastic part,
    the external connection is flexible, and
    the embedded portion of the external connection is connected to the device, extends from the device to the end of the base on and along the base such as to follow a shape of the base, and is insert-molded in the plastic part.

6. The device module according to claim 1, wherein
    the base includes a curved portion, and
    the embed portion includes a curved portion following a shape of the curved portion of the base.

7. The device module according to claim 1, wherein the base is formed of at least one of a plastic film or an insulating plastic material.

8. The device module according to claim 5, wherein the external connection is a flexible printed board or a flexible and insulating film.

9. The device module according to claim 1, wherein capacitive touch panel or capacitive touch switch is configured to sense a change in capacitance that occurs when a detection object touches a touch sensing surface.

10. The device module according to claim 9, wherein the capacitive touch panel comprises:
    a first substrate having first and second faces in a thickness direction of the device module,
    a plurality of first electrodes provided on the first face of the first substrate, and
    a plurality of second electrodes provided on the second face of the first substrate.

11. The device module according to claim 9, wherein the capacitive touch panel comprises:
    a first substrate,
    a plurality of first electrodes provided on the first substrate,
    an insulating layer provided on the first substrate so as to cover the first electrodes, and
    a plurality of second electrodes provided on the insulating layer.

12. The device module according to claim 9, wherein the capacitive touch panel comprises:
    a first substrate having a first face,
    a second substrate having a first face opposed to the first face of the first substrate, a plurality of first electrodes provided on the first face of the first substrate, and a plurality of second electrodes provided on the first face of the second substrate.

13. The device module according to claim 9, wherein the capacitive touch panel comprises:

a first film being insulative and having first and second faces in the thickness direction, a plurality of first electrodes provided on the first face of the first film, and a plurality of second electrodes provided on the second face of the first film.

14. The device module according to claim 9, wherein the capacitive touch panel comprises:

a first film being insulative, a plurality of first electrodes provided on the first film, a second film being insulative and provided on the first film so as to cover the first electrodes, and a plurality of second electrodes provided on the second film.

15. The device module according to claim 9, wherein the capacitive touch panel comprises:

a first film being insulative and having a first face, a second film being insulative and having a first face opposed to the first face of the first film, a plurality of first electrodes provided on the first face of the first film, and a plurality of second electrodes provided on the first face of the second film.

* * * * *